(12) United States Patent
Wang et al.

(10) Patent No.: US 11,949,024 B2
(45) Date of Patent: Apr. 2, 2024

(54) SEMICONDUCTOR SWITCH DEVICE AND PREPARATION METHOD THEREOF, AND SOLID-STATE PHASE SHIFTER

(71) Applicant: HUAWEI TECHNOLOGIES CO., LTD., Guangdong (CN)

(72) Inventors: Yufeng Wang, Shanghai (CN); Yuantao Zhou, Shenzhen (CN); Wei Wan, Dongguan (CN); Jiang Qin, Shanghai (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 572 days.

(21) Appl. No.: 17/215,716

(22) Filed: Mar. 29, 2021

(65) Prior Publication Data
US 2021/0217900 A1 Jul. 15, 2021

Related U.S. Application Data

(63) Continuation of application No. PCT/CN2019/084647, filed on Apr. 26, 2019.

(30) Foreign Application Priority Data

Sep. 30, 2018 (CN) .......................... 201811162215.8

(51) Int. Cl.
*H01L 29/868* (2006.01)
*H01L 29/06* (2006.01)
(Continued)

(52) U.S. Cl.
CPC ........ *H01L 29/868* (2013.01); *H01L 29/0684* (2013.01); *H01Q 3/36* (2013.01); *H03H 11/16* (2013.01)

(58) Field of Classification Search
CPC ............... H01L 29/868; H01L 29/0684; H01L 29/66136; H01L 29/0657; H01Q 3/36; H03H 11/16
See application file for complete search history.

(56) References Cited

U.S. PATENT DOCUMENTS 4,200,877 A 4/1980 Suzuki et al.
4,410,902 A * 10/1983 Malik ................... H01L 29/365
257/656
(Continued)

FOREIGN PATENT DOCUMENTS

CN 101170110 A 4/2008
CN 100524845 C 8/2009
(Continued)

OTHER PUBLICATIONS

V.S. Senthil Srinivasan et al, Low temperature Epitaxial Germanium P+IN+IP+ Selector for RRAM, 2015 73rd Annual Device Research Conference, Jun. 21, 2015 (DRC), IEEE, XP033188873, total 2 pages.

(Continued)

*Primary Examiner* — Samuel Park
(74) *Attorney, Agent, or Firm* — WOMBLE BOND DICKINSON (US) LLP

(57) ABSTRACT

This application provides a semiconductor switch device and a preparation method thereof, and a solid-state phase shifter. The semiconductor switch device includes a second semiconductor layer, a first intrinsic layer, a first semiconductor layer, a second intrinsic layer, and a third semiconductor layer that are stacked in a sandwich structure. The first intrinsic layer is located between the second semiconductor layer and the first semiconductor layer, and the first intrinsic layer, the second semiconductor layer, and the first semiconductor layer form a first PIN diode. The second intrinsic layer is located between the third semiconductor (Continued)

layer and the first semiconductor layer, and the second intrinsic layer, the third semiconductor layer, and the first semiconductor layer form a second PIN diode. The first PIN diode and the second PIN diode are axisymmetrically disposed.

17 Claims, 22 Drawing Sheets

(51) Int. Cl.
*H01Q 3/36* (2006.01)
*H03H 11/16* (2006.01)

(56) References Cited

U.S. PATENT DOCUMENTS

| | | | |
|---|---|---|---|
| 4,600,935 A * | 7/1986 | Dresner | H01L 29/1604 257/656 |
| 5,311,047 A * | 5/1994 | Chang | H01L 31/1105 257/53 |
| 6,777,771 B1 | 8/2004 | Marumoto et al. | |
| 6,946,717 B2 | 9/2005 | Hoag et al. | |
| 7,005,725 B2 * | 2/2006 | Poveda | H01L 27/0814 257/656 |
| 2002/0102804 A1 | 8/2002 | Nagase et al. | |
| 2003/0218575 A1 | 11/2003 | Walker et al. | |
| 2008/0099881 A1 * | 5/2008 | Jung | H01Q 9/0407 257/E29.174 |
| 2013/0291933 A1 | 11/2013 | Kupich et al. | |
| 2015/0249182 A1 | 9/2015 | Huang et al. | |
| 2015/0303977 A1 | 10/2015 | Puente et al. | |
| 2017/0309821 A1 * | 10/2017 | Paz de Araujo | H10N 99/03 |
| 2018/0190836 A1 * | 7/2018 | Ningaraju | H01L 29/10 |
| 2018/0204761 A1 | 7/2018 | Feilchenfeld et al. | |

FOREIGN PATENT DOCUMENTS

| | | |
|---|---|---|
| CN | 202423352 U | 9/2012 |
| CN | 101820006 B | 10/2013 |
| CN | 203644806 U | 6/2014 |
| CN | 102067318 B | 7/2014 |
| CN | 105281030 A | 1/2016 |
| CN | 103828069 B | 10/2016 |
| CN | 103208567 B | 3/2017 |
| CN | 107046086 A | 8/2017 |
| CN | 107192473 A | 9/2017 |
| CN | 107219496 A | 9/2017 |
| CN | 206727074 U | 12/2017 |
| CN | 108447940 A | 8/2018 |
| EP | 2487712 B1 | 11/2017 |

OTHER PUBLICATIONS

E. W. Jacobs et al, Photo-Injection p-i-n Diode Switch for High-Power RF Switching, IEEE Transactions on Microwave Theory and Techniques, vol. 50, No. 2, Feb. 2002, XP011038614, total 7 pages.

* cited by examiner

SEMICONDUCTOR SWITCH DEVICE AND PREPARATION METHOD THEREOF, AND SOLID-STATE PHASE SHIFTER

CROSS-REFERENCE TO RELATED APPLICATIONS

This application is a continuation of International Application No. PCT/CN2019/084647, filed on Apr. 26, 2019, which claims priority to Chinese Patent Application No. 201811162215.8 filed on Sep. 30, 2018. The disclosures of the aforementioned applications are hereby incorporated by reference in their entireties.

TECHNICAL FIELD

The present invention relates to the technical field of diodes, and in particular, to a semiconductor switch device and a preparation method thereof, and a solid-state phase shifter including the semiconductor switch device.

BACKGROUND

A mainstream PIN diode in the industry is a discrete device. In other words, a single-diode cell is included in a package of each device. However, linearity optimization by using a discrete device has difficulties in device costs, size and component matching. Use of PIN diodes connected in series or in parallel requires discrete diode devices to have precisely matched parameters. However, in practice, because a semiconductor process varies in different batches, wafers, and even wafer sizes, an overall error range of the parameters is as high as ±20%, and a mismatch leads to a significant reduction in improvement of circuit linearity.

To facilitate a simple serial or parallel connection for a user, some vendors encapsulate cells of two PIN diodes in one chip package. There are a plurality of connection modes, including a common-anode connection, a common-cathode connection, a serial connection, and the like. The common-anode connection and the common-cathode connection can be implemented as parallel connections or reverse serial connections, and the integrated device brings no substantial improvement over two separate discrete PIN diodes.

SUMMARY

This application provides a semiconductor switch device and a preparation method thereof, and a solid-state phase shifter, to improve performance of the semiconductor switch device.

According to a first aspect, a semiconductor switch device is provided. The semiconductor switch device includes a second semiconductor layer, a first intrinsic layer, a first semiconductor layer, a second intrinsic layer, and a third semiconductor layer that are stacked in a sandwich structure. The first intrinsic layer and the second intrinsic layer have a same thickness, and are made from materials that have a same doping concentration coefficient. The first intrinsic layer is located between the second semiconductor layer and the first semiconductor layer, and the second semiconductor layer, the first intrinsic layer, and the first semiconductor layer form a first PIN diode. The second intrinsic layer is located between the third semiconductor layer and the first semiconductor layer, and the first semiconductor layer, the third semiconductor layer, and the second intrinsic layer form a second PIN diode. In addition, during formation of the first PIN diode and the second PIN diode, the first PIN diode and the second PIN diode are axisymmetrically disposed.

During disposing of the first to the third semiconductor layers, both the second semiconductor layer and the third semiconductor layer are of opposite electrodes to the first semiconductor layer. For example, the first semiconductor layer is an N+ semiconductor layer, and the second semiconductor layer and the third semiconductor layer are P+ semiconductor layers; or the first semiconductor layer is a P+ semiconductor layer, and the second semiconductor layer and the third semiconductor layer are N+ semiconductor layers.

It should be noted that the semiconductor switch device provided in this application includes two PIN diodes. The first semiconductor layer, the first intrinsic layer, and the second semiconductor layer form one PIN diode, and the first semiconductor layer, the second intrinsic layer, and the third semiconductor layer form the other PIN diode. The PIN diode has a geometrically centrosymmetric pattern. The semiconductor switch device provided in this application can implement parameter self-matching between the two PIN diodes, and therefore improve linearity. In addition, a compact structure of the entire semiconductor switch device allows twice a quantity of PIN diodes in a same area, reducing costs in chip packaging by half Optionally, the first semiconductor layer, the second semiconductor layer, and the third semiconductor layer are in a same shape, and may be in a symmetrical shape such as a circle and a square.

With reference to the first aspect, in a first possible embodiment, a ratio of an area of a surface, of the second semiconductor layer, facing the first semiconductor layer to an area of a surface, of the third semiconductor layer, facing the first semiconductor layer is 1:N, where N is a rational number greater than or equal to 1, for example, 1, 2, 3, 5, or another positive rational number. Linearity of a circuit to which the semiconductor switch device is applied may be improved through a setting of a ratio of areas.

With reference to the first aspect or the first possible embodiment of the first aspect, in a second possible embodiment, in a direction of a thickness of the first semiconductor layer, a projection of the second semiconductor layer on a first plane coincides with a projection of the third semiconductor layer on the first plane, and the first plane is a plane on which a surface, of the third semiconductor layer, facing the second semiconductor layer is located. In this case, the ratio of the area of the surface, of the second semiconductor layer, facing the first semiconductor layer to the area of the surface, of the third semiconductor layer, facing the first semiconductor layer is 1:1, to improve linearity of the semiconductor switch device.

With reference to the first aspect, in a third possible embodiment, the semiconductor switch device further includes a first insulation layer, where the first insulation layer covers at least a part of a surface, of the second semiconductor layer, facing away from the first intrinsic layer. It should be noted that the first insulation layer may be made from silicon dioxide, or another insulation material. The semiconductor switch device is protected through the insulation layer.

Optionally, the semiconductor switch device further includes a second insulation layer, where the second insulation layer covers at least a part of a surface, of the third semiconductor layer, facing away from the second intrinsic layer. It should be noted that the second insulation layer may be made from silicon dioxide, or certainly another insulation material. The semiconductor switch device is protected through the disposed insulation layer.

With reference to the third possible embodiment of the first aspect, in a fourth possible embodiment, a through hole is disposed on the first insulation layer, and the through hole is filled with a pad connecting to the first semiconductor layer, so that the first PIN diode is connected to an external circuit through the pad.

Optionally, a through hole is disposed on the second insulation layer, and the through hole is filled with a pad connecting to the first semiconductor layer, so that the second PIN diode is connected to the external circuit through the pad.

According to a second aspect, this application provides a solid-state phase shifter. The solid-state phase shifter includes semiconductor switch devices, according to any one of the possible embodiments, on a plurality of branches, where at least one of the semiconductor switch devices is disposed on each branch, and a phase difference is generated between radio frequency signals transmitted on the plurality of branches by turning on or off the semiconductor switch device. In the used semiconductor switch device, the two PIN diodes each having a geometrically centrosymmetric pattern are used, to implement parameter self-matching between the two PIN diodes and therefore improve linearity. In this way, an effect of the solid-state phase shifter is improved.

According to a third aspect, a massive multiple-input multiple-output (Massive MIMO) antenna array is provided, where the antenna array includes the foregoing solid-state phase shifter and a plurality of antenna units, and the solid-state phase shifter is configured to change a phase relationship between the plurality of antenna units. In the used semiconductor switch device in the solid-state phase shifter, the two PIN diodes each having a geometrically centrosymmetric pattern are used, to implement parameter self-matching between the two PIN diodes and therefore improve linearity. In this way, a use effect of the antenna array is improved.

According to a fourth aspect, a communications device is provided. The communications device includes the massive multiple-input multiple-output antenna array and a radio frequency signal transceiver. The massive multiple-input multiple-output antenna array is configured to receive a radio frequency signal sent by the radio frequency signal transceiver, or is configured to send a radio frequency signal to the radio frequency signal transceiver. By using the foregoing antenna array, a communication effect of the communications device is improved.

According to a fifth aspect, a method for preparing a semiconductor switch device is provided. The preparation method includes the following steps:

forming a first intrinsic layer and a second intrinsic layer on two opposite surfaces of a first semiconductor layer, where the first intrinsic layer and the second intrinsic layer have a same thickness, and are made from materials that have a same doping concentration coefficient;

forming a second semiconductor layer on a surface, of the first intrinsic layer, facing away from the first semiconductor layer, where the second semiconductor layer, the first intrinsic layer, and the first semiconductor layer form a first PIN diode, and when one of the second semiconductor layer and the first semiconductor layer is a P+ semiconductor layer, the other is an N+ semiconductor layer; and forming a third semiconductor layer on a surface, of the second intrinsic layer, facing away from the first semiconductor layer, where the third semiconductor layer, the second intrinsic layer, and the first semiconductor layer form a second PIN diode, and when one of the third semiconductor layer and the first semiconductor layer is a P+ semiconductor layer, the other is an N+ semiconductor layer; where the first PIN diode and the second PIN diode are axisymmetrically disposed; and the first semiconductor layer is a P+ semiconductor layer, and the second semiconductor layer and the third semiconductor layer are N+ semiconductor layers; or the first semiconductor layer is an N+ semiconductor layer, and the second semiconductor layer and the third semiconductor layer are P+ semiconductor layers.

In the foregoing preparation method, the two PIN diodes each having a geometrically centrosymmetric pattern can be used to implement parameter self-matching between the two PIN diodes and therefore improve linearity. In addition, a compact structure of the entire semiconductor switch device allows twice a quantity of PIN diodes in a same area, reducing costs in chip packaging by half.

With reference to the fifth aspect, in a first possible embodiment, the forming a first intrinsic layer and a second intrinsic layer on two opposite surfaces of a first semiconductor layer includes:

depositing a first insulation layer on one surface of the first semiconductor layer; and providing a first window on the first insulation layer, and forming the first intrinsic layer inside the first window; and depositing a second insulation layer on another surface of the first semiconductor layer; and providing a second window on the second insulation layer, and forming the second intrinsic layer inside the second window.

In the foregoing preparation method, the first intrinsic layer is protected through the disposed first insulation layer and second insulation layer.

With reference to the first possible embodiment of the fifth aspect, in a second possible embodiment, the forming a second semiconductor layer on a surface, of the first intrinsic layer, facing away from the first semiconductor layer includes: depositing the second semiconductor layer inside the first window and on the surface, of the first intrinsic layer, facing away from the first semiconductor layer.

With reference to the first possible embodiment of the fifth aspect, in a third possible embodiment, the forming a third semiconductor layer on a surface, of a second intrinsic layer, facing away from the first semiconductor layer includes: depositing the third semiconductor layer inside the second window and on the surface, of the second intrinsic layer, facing away from the first semiconductor layer.

With reference to the first possible embodiment of the fifth aspect, in a fourth possible embodiment, the production method further includes: separately forming pads on the first semiconductor layer, the second semiconductor layer, and the third semiconductor layer. The semiconductor switch device is connected to an external circuit through the disposed pad.

DESCRIPTION OF EMBODIMENTS

To make the objectives, technical solutions, and advantages of this application clearer, the following further describes this application in detail with reference to the accompanying drawings.

To facilitate understanding of a semiconductor switch device provided in the embodiments of this application, the following first describes an application scenario of the semiconductor switch device provided in the embodiments of this application. The semiconductor switch device is used as a control switch, and is applied to a solid-state phase shifter that is configured to transmit or receive a signal.

Figure 1A:
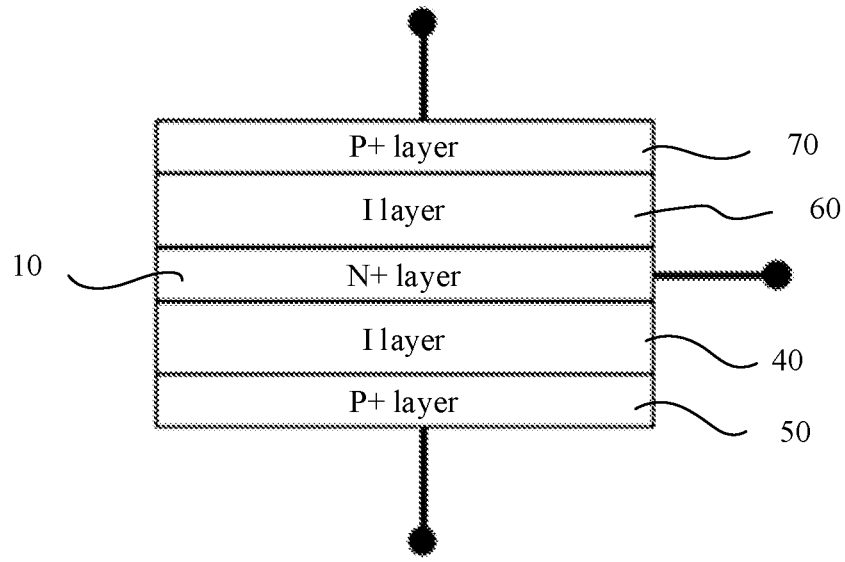
FIG. 1a and FIG. 1b are a principle diagram of a semiconductor switch device according to an embodiment of this application.
Figure 1B:
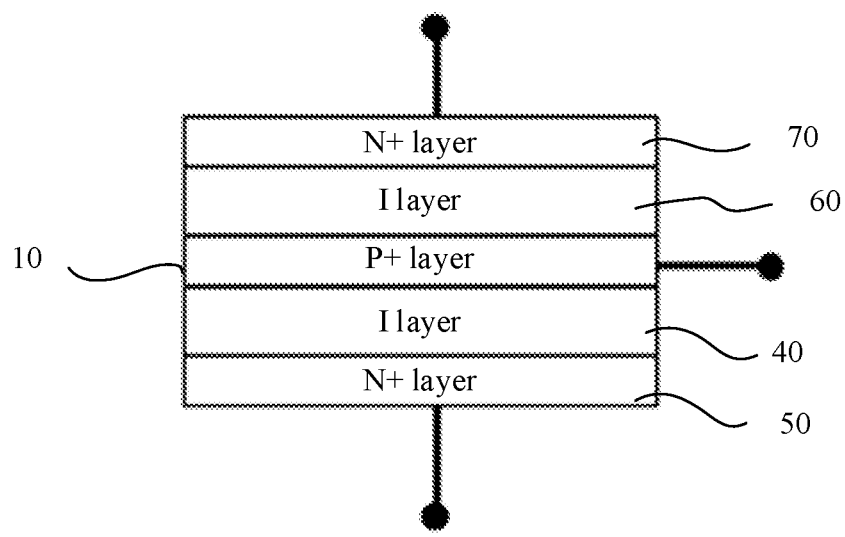

First, FIG. 1a and FIG. 1b are a schematic diagram of a semiconductor switch device according to an embodiment of this application. In this embodiment of this application, the semiconductor switch device is disposed in a stacked structure, and includes two PIN diodes. For ease of description, the two PIN diodes are named as a first PIN diode and a second PIN diode. Still referring to FIG. 1a and FIG. 1b, the first PIN diode and the second PIN diode are stacked in a sandwich structure. The first PIN diode includes a first semiconductor layer 10, a first intrinsic layer 60, and a second semiconductor layer 70 that are stacked, where the first intrinsic layer 60 is located between the first semiconductor layer 10 and the second semiconductor layer 70. In other words, the first semiconductor layer 10, the first intrinsic layer 60, and the second semiconductor layer 70 form the first PIN diode. When the layers are disposed, the first semiconductor layer 10 and the second semiconductor layer 70 are two semiconductor layers of opposite electrodes. As shown in FIG. 1a, the first semiconductor layer 10 is an N+ semiconductor layer, and the second semiconductor layer 70 is a P+ semiconductor layer. Alternatively, as shown in FIG. 1b, the first semiconductor layer 10 is a P+ semiconductor layer, and the second semiconductor layer 70 is an N+ semiconductor layer.

A structure of the second PIN diode is similar to that of the first PIN diode. The second PIN diode includes the first semiconductor layer 10, a second intrinsic layer 40, and a third semiconductor layer 50 that are stacked in a sandwich structure, where the second intrinsic layer is located between the first semiconductor layer 10 and the third semiconductor layer 50. The second PIN diode and the first PIN diode share the first semiconductor layer. Therefore, during formation of the semiconductor switch device described in this application, the third semiconductor layer 50 and the second semiconductor layer 70 are of a same electrode that is opposite to the electrode of the first semiconductor layer 10. As shown in FIG. 1a, if the first semiconductor layer 10 is an N+ semiconductor layer, the third semiconductor layer 50 is a P+ semiconductor layer. Alternatively, as shown in FIG. 1b, if the first semiconductor layer 10 is a P+ semiconductor layer, the third semiconductor layer 50 is an N+ semiconductor layer.

Still referring to FIG. 1a and FIG. 1b, in the structures shown in FIG. 1a and FIG. 1b, the first PIN diode and the second PIN diode are stacked, that is, the second semiconductor layer 70, the first intrinsic layer 60, the first semiconductor layer 10, the second intrinsic layer 40, and the third semiconductor layer 50 are stacked in a sandwich structure. The first intrinsic layer 60 and the second intrinsic layer 40 have a same thickness, and are made from materials that have a same doping concentration coefficient. Specifically, during preparation of the first intrinsic layer and the second intrinsic layer 40, the first intrinsic layer 60 and the second intrinsic layer 40 are made from materials that have a same doping concentration, and the doping concentration changes with the thickness of the intrinsic layer.

During disposing of the first semiconductor layer 10, the second semiconductor layer 70, and the third semiconductor layer 50, connection surfaces have a same shape. The connection surfaces refer to a surface, of the first semiconductor layer 10, facing the second semiconductor layer 70 and a surface, of the second semiconductor layer 70, facing the first semiconductor layer 10 (the two surfaces are opposite); and a surface, of the first semiconductor layer 10, facing the third semiconductor layer 50 and a surface, of the third semiconductor layer 50, facing the first semiconductor layer 10 (the two surfaces are also opposite). The connection surface may be in a centrosymmetric pattern such as a circle, a square, or another shape.

During specific disposing of the first intrinsic layer 60 and the second intrinsic layer 40, the first intrinsic layer 60 and the second intrinsic layer 40 are located on two sides of the first semiconductor layer 10, and are fitted to two opposite surfaces of the first semiconductor layer 10. The two intrinsic layers are from a same wafer, eliminating impact caused by a difference between batches of wafers. In the prior approaches, parameters of used wafers are different because of a difference between batches and a difference between different wafers in a same batch. A conventional method cannot ensure that chips are from a same wafer in a same batch. Even if a complex and expensive precise material control method is used to select dies on a same wafer, a difference between the dies in different positions on the same wafer cannot be eliminated, and therefore a circuit mismatch and performance degradation are unavoidable. In this application, the first PIN diode and the second PIN diode that are stacked are from a same wafer. Therefore, a difference between batches of wafers and a difference between wafers may be reduced.

During preparation, parameters tend to be different due to a characteristic that a semiconductor process varies with a planar position of a wafer. Therefore, in this embodiment of this application, the first PIN diode and the second PIN diode are axisymmetrically disposed (i.e., exhibiting symmetry around an axis). As shown in FIG. 1a, the symmetry axis refers to a straight line perpendicular to a plane on which a wafer is connected to the first semiconductor layer 10. In addition, the first intrinsic layer 60, the second intrinsic layer 40, the first semiconductor layer 10, the second semiconductor layer 70, and the third semiconductor layer 50 are axisymmetrically disposed during specific disposing. During specific disposing, a placement direction of the semiconductor switch device shown in FIG. 1a is used as a reference for a direction, and vertical axes of the first intrinsic layer 60, the second intrinsic layer 40, the first semiconductor layer 10, the second semiconductor layer 70, and the third semiconductor layer 50 are the same. When a parameter difference occurs in a wafer due to non-uniformity in a semiconductor process, because the first PIN diode and the second PIN diode are centrosymmetric, process variations of the first PIN diode and the second PIN diode are the same, offsetting the generated parameter difference. In this way, parameters of the first PIN diode and the second PIN diode are consistent and automatically match. This resolves a matching problem between the first PIN diode and the second PIN diode.

When the first PIN diode and the second PIN diode are stacked and matched, different area ratios may be used. When corresponding to the semiconductor switch device, the area ratio is correspondingly a ratio of an area of a surface, of the second semiconductor layer 70, facing the first semiconductor layer 10 to an area of a surface, of the third semiconductor layer 50, facing the first semiconductor layer 10, and the ratio is 1:N, where N is a rational number greater than or equal to 1, for example, 1, 2, 3, 5, or another positive rational number. For ease of understanding, the following performs simulation processing for cases of different area ratios between the first PIN diode and the second PIN diode.

First, simulation is performed for a case in which an area ratio between the first PIN diode and the second PIN diode is 1:1.

Figure 2A:
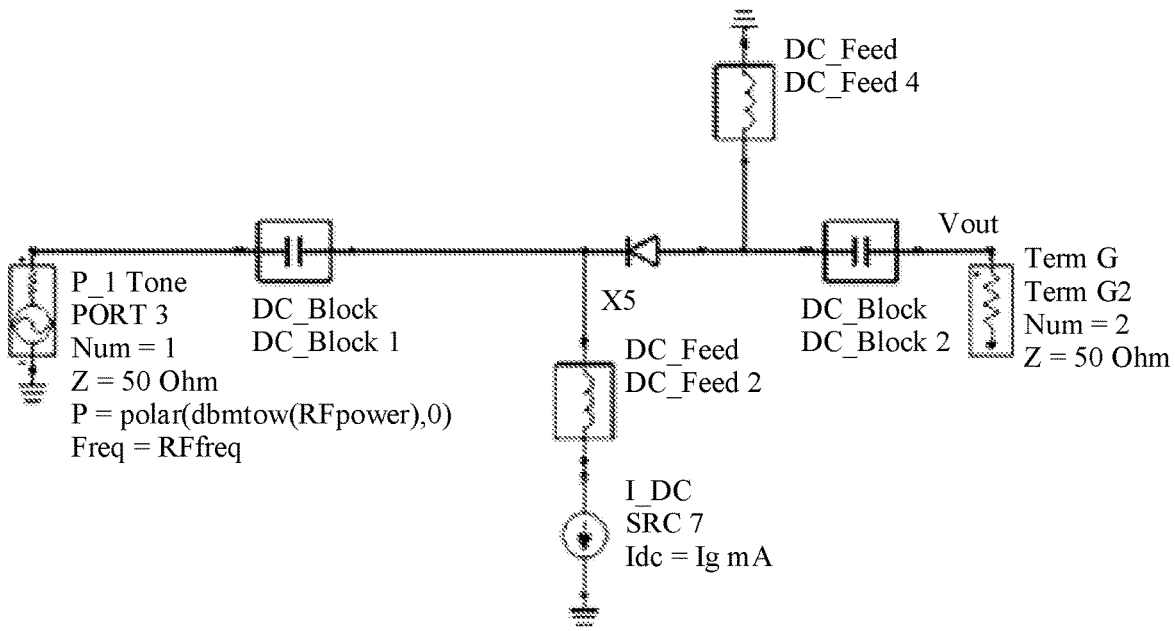
FIG. 2a shows a harmonic simulation circuit of a single diode in a forward biased state.
Figure 2B:
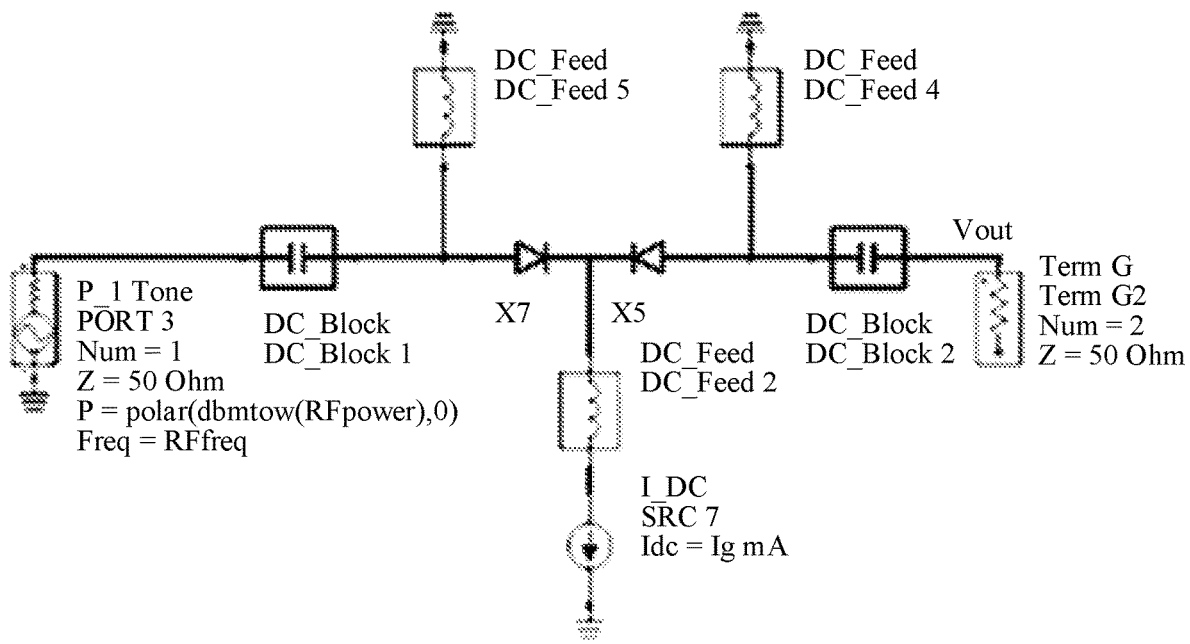
FIG. 2b shows a harmonic simulation circuit of a semiconductor switch device in a forward biased state according to an embodiment of this application.
Figure 3A:
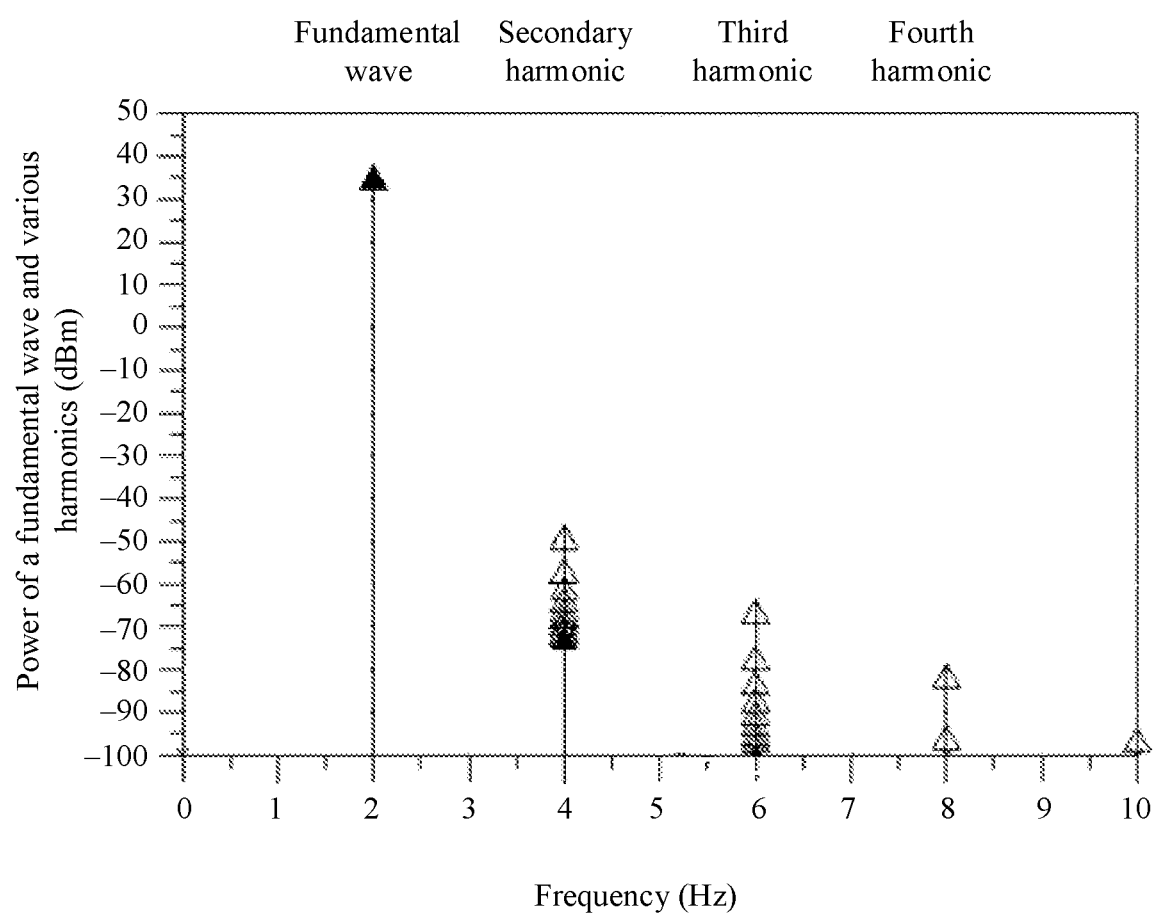
FIG. 3a shows a simulation result of a single diode by using harmonic balance.
Figure 3B:
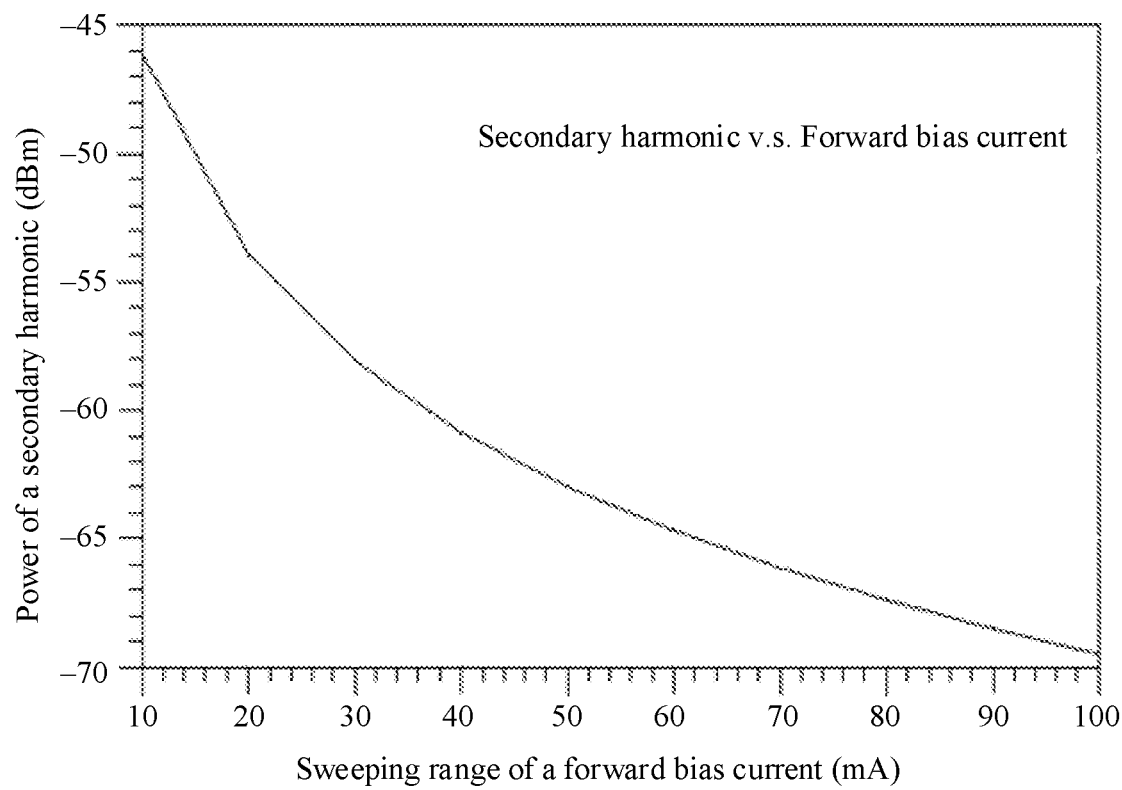
FIG. 3b shows a variation trend of a secondary harmonic of a single diode with a forward bias current.
Figure 4A:
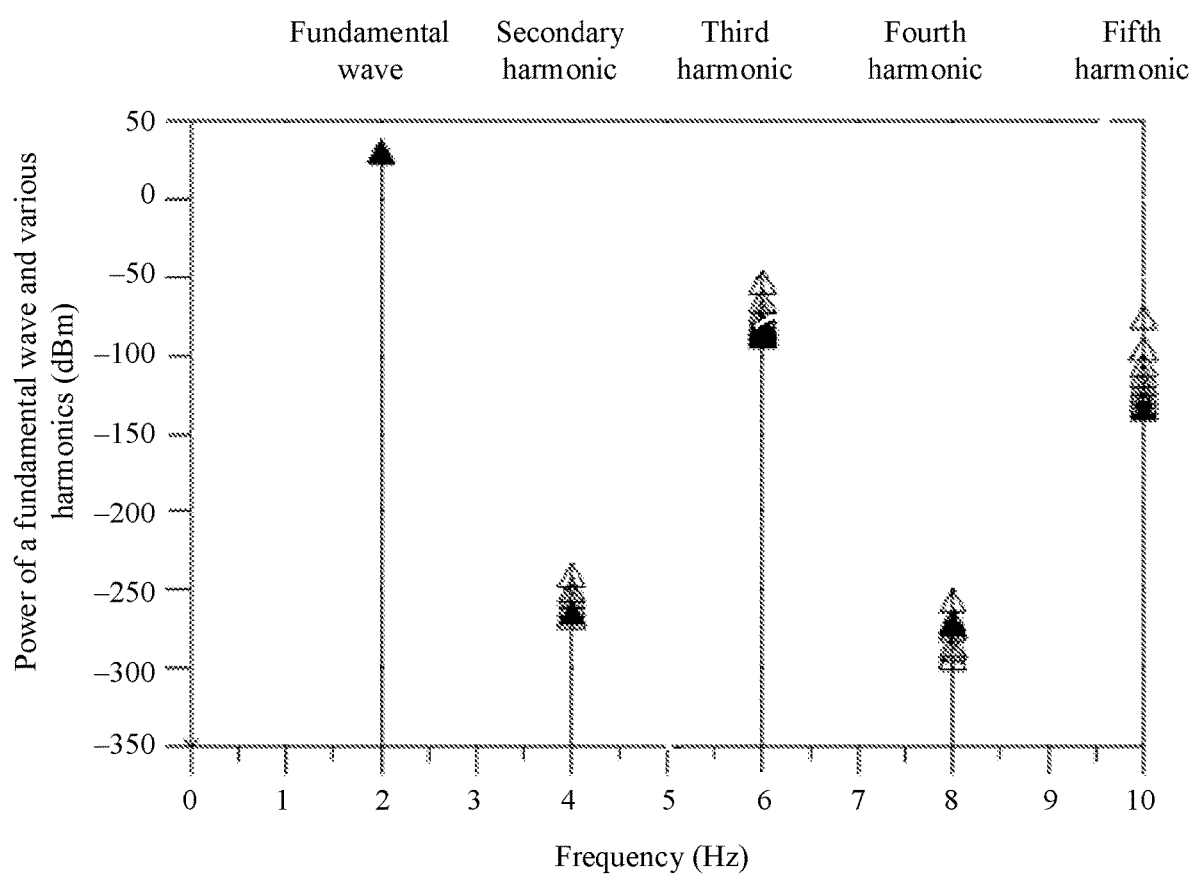
FIG. 4a shows a simulation result of a semiconductor switch device by using harmonic balance according to an embodiment of this application.
Figure 4B:
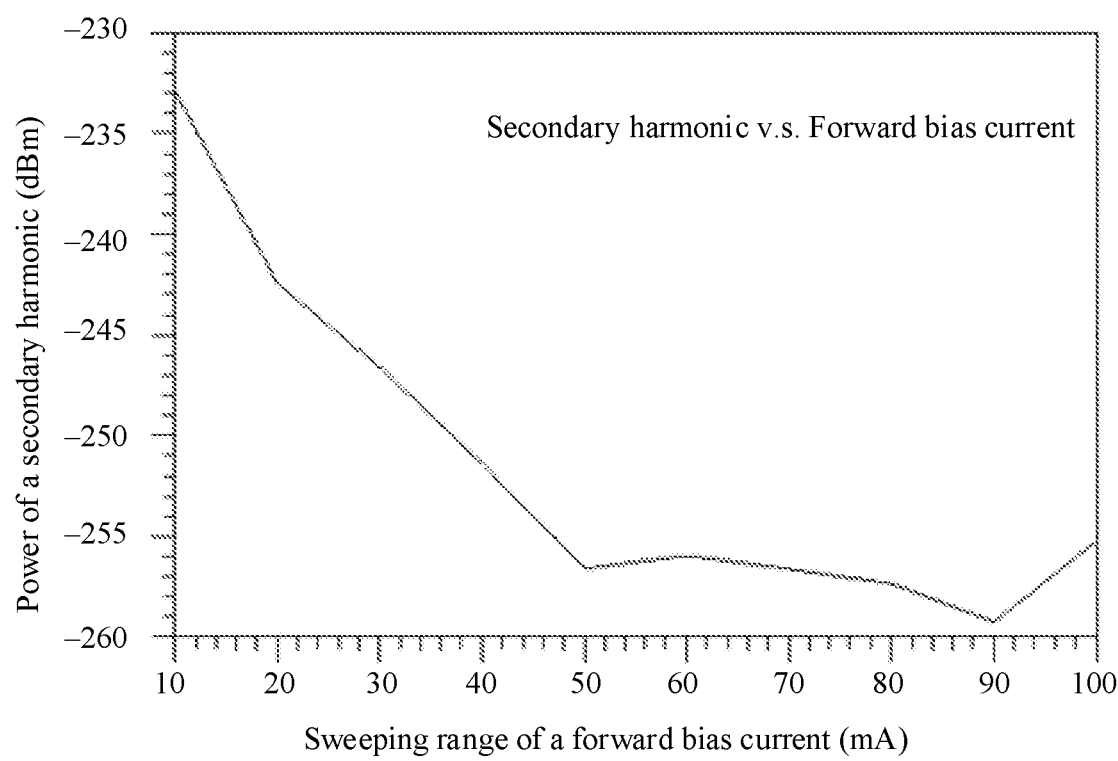
FIG. 4b shows a variation trend of a secondary harmonic of a semiconductor switch device with a forward bias current according to an embodiment of this application.

A PIN junction nonlinear model is imported into ADS software, and a harmonic balance simulation engine is used to separately simulate a PIN junction in a forward biased state and a PIN junction in a reverse biased state, to obtain a second harmonic, third harmonic, fourth harmonic, fifth harmonic, or another harmonic nonlinear spectrum product. During simulation, a signal source is set to a 2 GHz 38 dBm tone, both input impedance and output impedance are 50 ohms, a sweeping range of a forward bias current is 10 mA to 100 mA, and a sweeping range of a reverse bias voltage is 50 V to 150 V. First, for the forward biased state, as shown in FIG. 2a and FIG. 2b, FIG. 2a shows a harmonic simulation circuit of a single diode in a forward biased state, and FIG. 2b shows a harmonic simulation circuit of a semiconductor switch device in a forward biased state according to an embodiment of this application. After the simulation is performed, simulation results in FIG. 3a to FIG. 4b are obtained. FIG. 3a shows a simulation result of a single diode by using harmonic balance, and FIG. 3b shows a variation trend of a secondary harmonic of a single diode with a forward bias current. FIG. 4a shows a simulation result of a semiconductor switch device by using harmonic balance according to an embodiment of this application, and FIG. 4b shows a variation trend of a secondary harmonic of a semiconductor switch device with a forward bias current according to an embodiment of this application. FIG. 3a and FIG. 4a are compared, and FIG. 3b and FIG. 4b are compared. Through comparison of simulation results, a canceling and compensating effect, in an ideal case, of harmonic nonlinear products of the single diode and the semiconductor switch device with an area ratio of 1:1 in this embodiment of this application is shown.

Figure 5A:
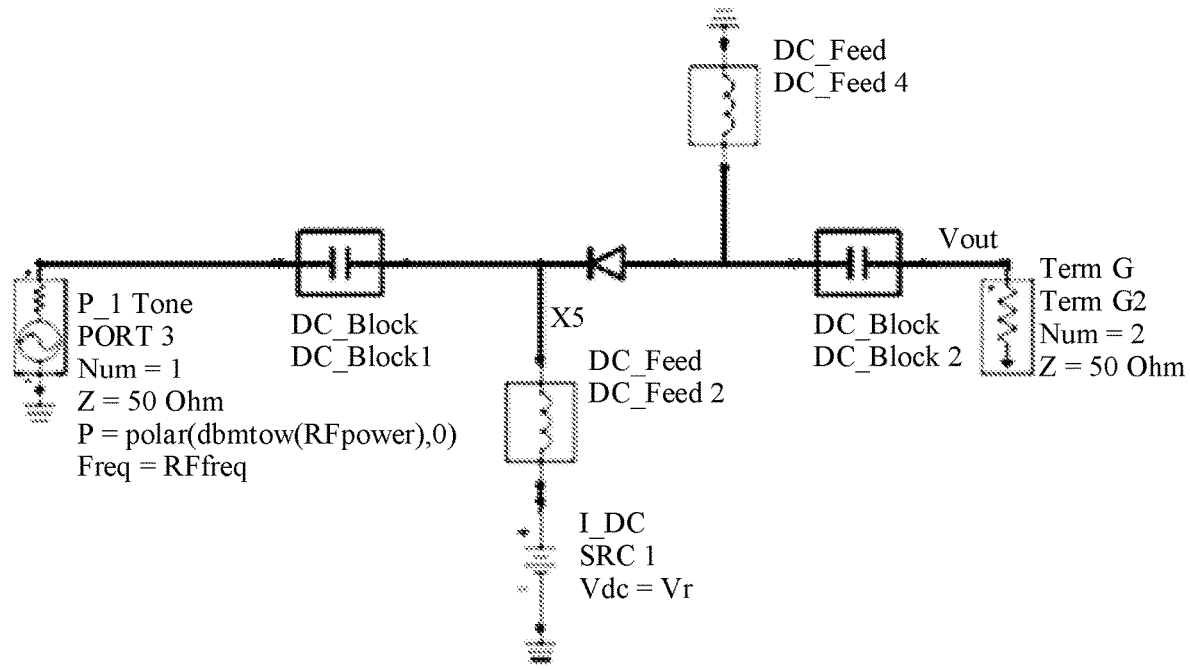
FIG. 5a shows a harmonic simulation circuit of a single diode in a reverse biased state.
Figure 5B:
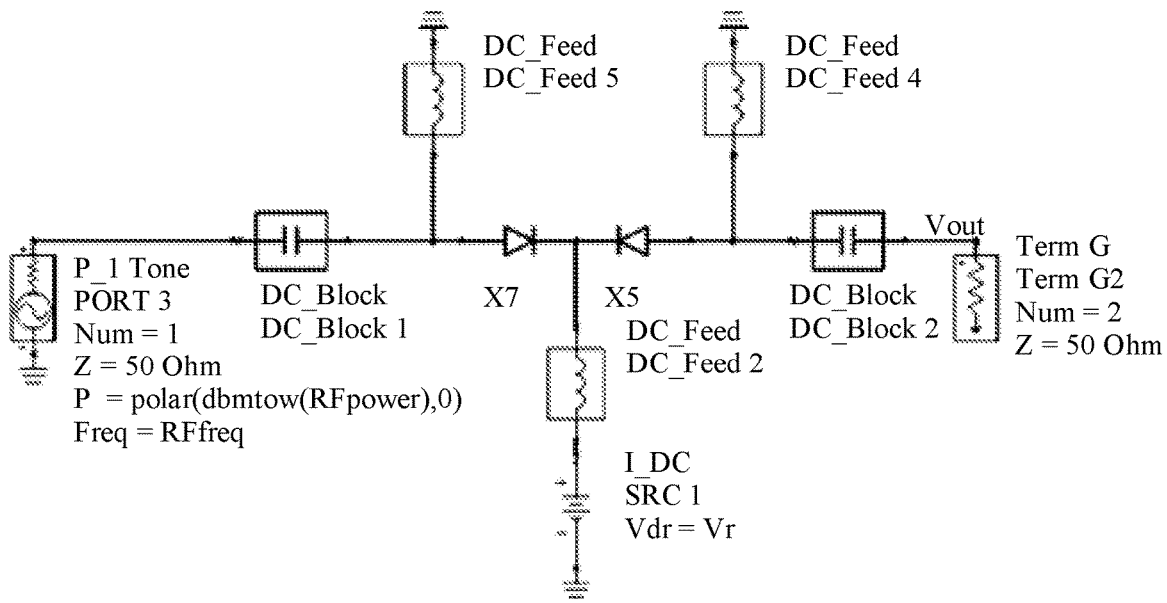
FIG. 5b shows a harmonic simulation circuit of a semiconductor switch device in a reverse biased state according to an embodiment of this application.
Figure 6A:
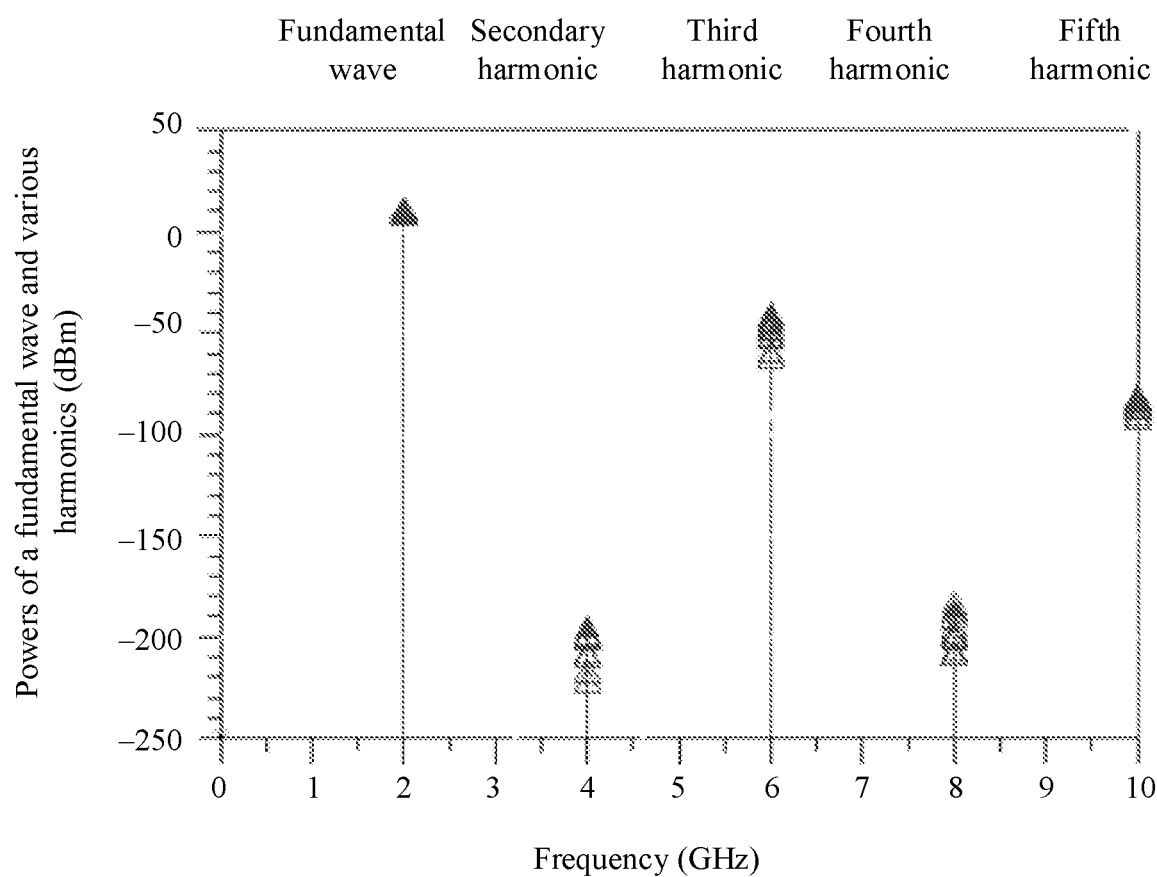
FIG. 6a shows a simulation result of a single diode by using harmonic balance.
Figure 6B:
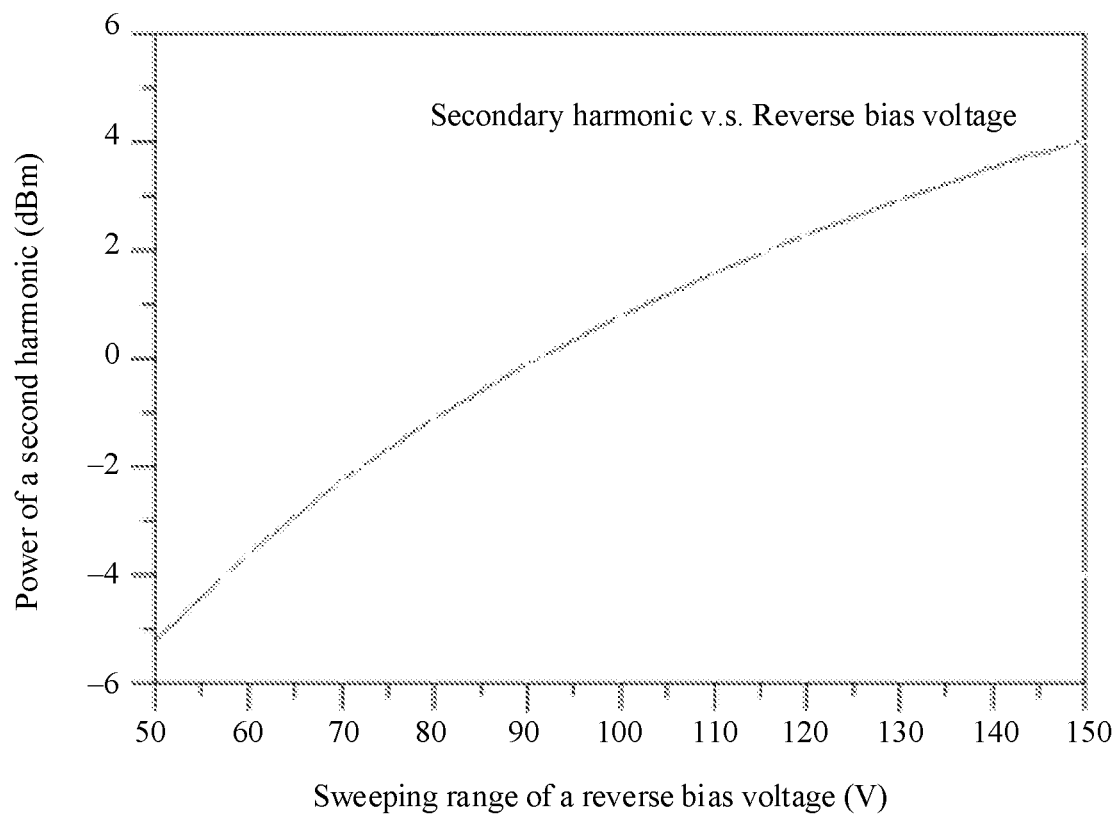
FIG. 6b shows a variation trend of a secondary harmonic of a single diode with a reverse bias voltage.
Figure 7A:
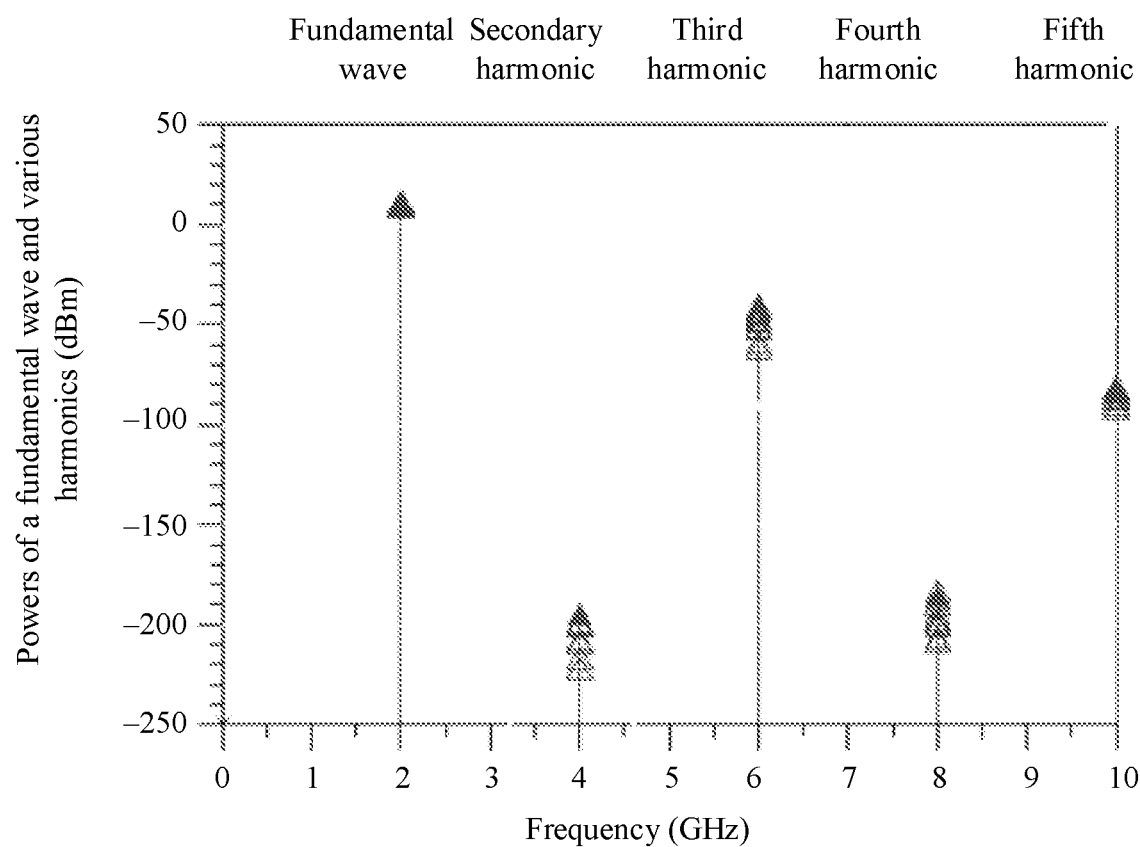
FIG. 7a shows a simulation result of a semiconductor switch device by using harmonic balance according to an embodiment of this application.
Figure 7B:
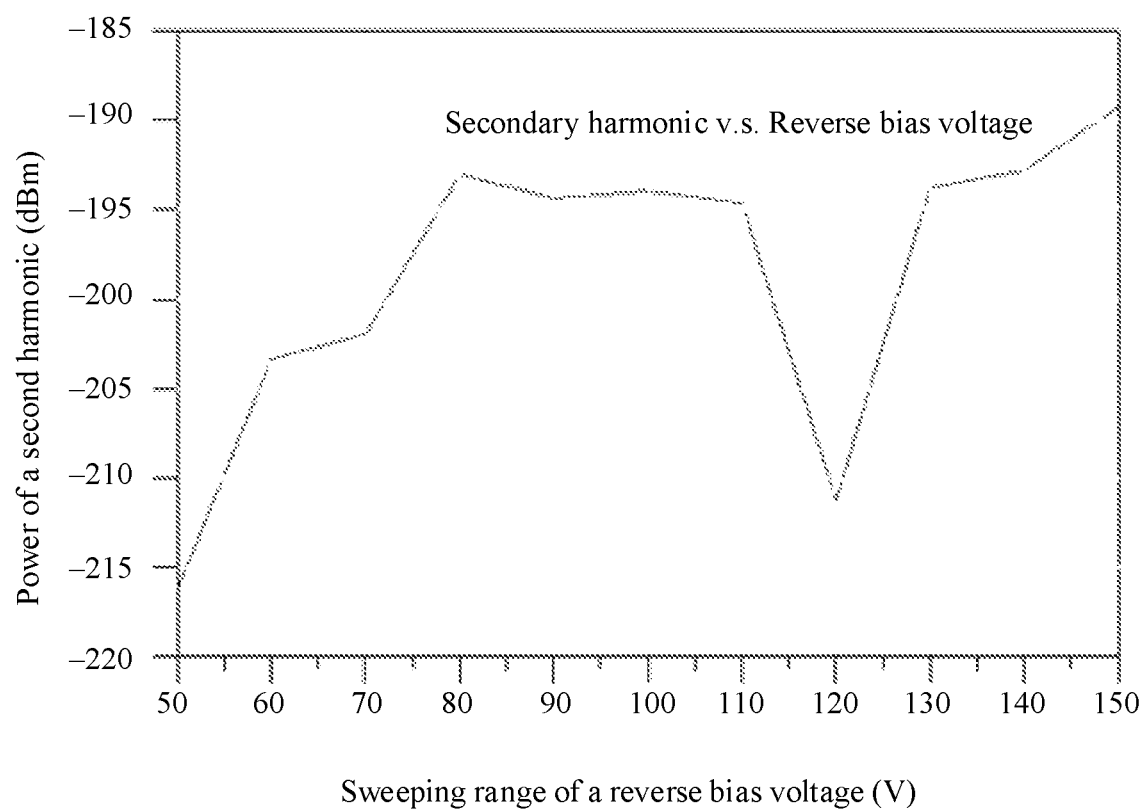
FIG. 7b shows a variation trend of a secondary harmonic of a semiconductor switch device with a reverse bias voltage according to an embodiment of this application.

For the reverse bias state, as shown in FIG. 5a and FIG. 5b, FIG. 5a shows a harmonic simulation circuit of a single diode in a reverse biased state, and FIG. 5b shows a harmonic simulation circuit of a semiconductor switch device in a reverse biased state according to an embodiment of this application. After the simulation is performed, simulation structures in FIG. 6a to FIG. 7b are obtained. FIG. 6a shows a simulation result of a single diode by using harmonic balance, and FIG. 6b shows a variation trend of a secondary harmonic of a single diode with a reverse bias voltage. FIG. 7a shows a simulation result of a semiconductor switch device by using harmonic balance according to an embodiment of this application, and FIG. 7b shows a variation trend of a secondary harmonic of a semiconductor switch device with a reverse bias voltage according to an embodiment of this application. FIG. 6a and FIG. 7a are compared, and FIG. 6b and FIG. 7b are compared. It can be learned from simulation results that, an even harmonic, especially a second harmonic, of the semiconductor switch device according to this embodiment of this application is 180-200 dB lower than that of a single-PIN diode. This result means that even harmonic products have been perfectly offset taking a rounding error of software floating point calculation into account. Parameters of the first PIN diode and the second PIN diode provided in this embodiment of this application can be completely matched. As a result, the semiconductor switch device provided in this embodiment of this application achieves 20 dB reduction compared with PIN diodes in prior approaches, and substantially improves nonlinear cancellation.

A specific area ratio between the first PIN diode and the second PIN diode may be precisely controlled in a manufacturing process. The ratio may be used as a free factor to adjust a nonlinear compensation coefficient of the device. This improves flexibility in designing the entire semiconductor switch device. During specific setting of an N value, the N value is determined depending on an application scenario of the semiconductor switch device. Specifically, the N value is finally determined based on design of experiments (DoE) data. By setting an appropriate N value, relatively good linearity can still be obtained when a parameter mismatch occurs in another part of the circuit.

Figure 8:
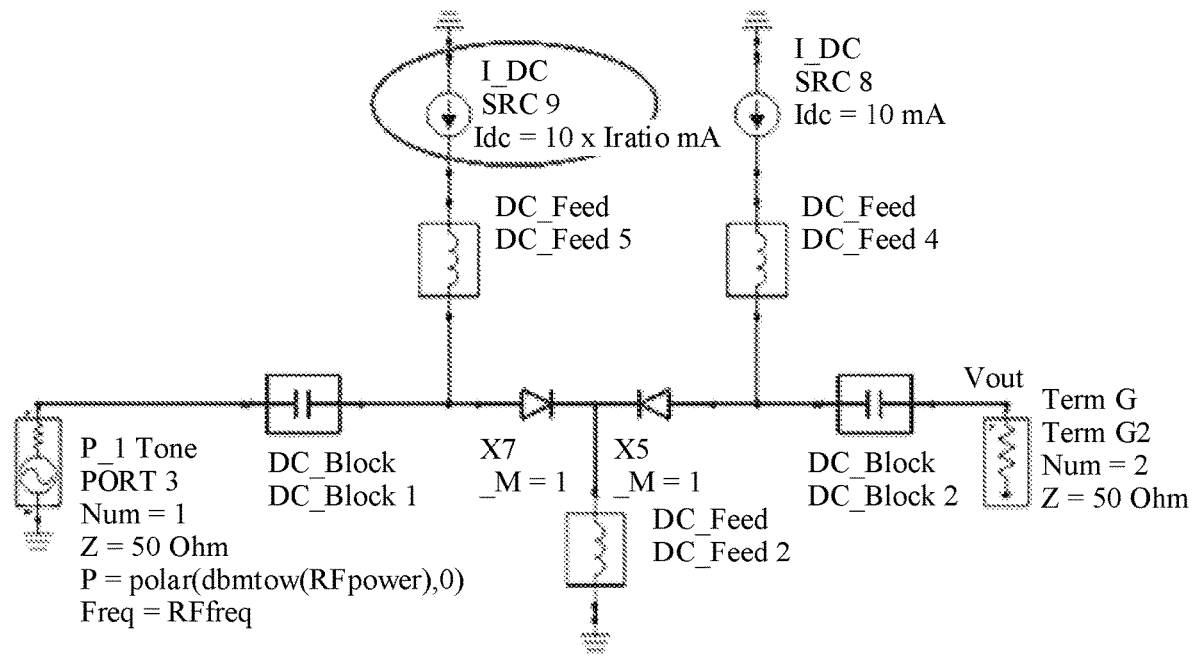
FIG. 8 shows a harmonic simulation circuit of a semiconductor switch device in a case of a forward bias current mismatch according to an embodiment of this application.
Figure 9:
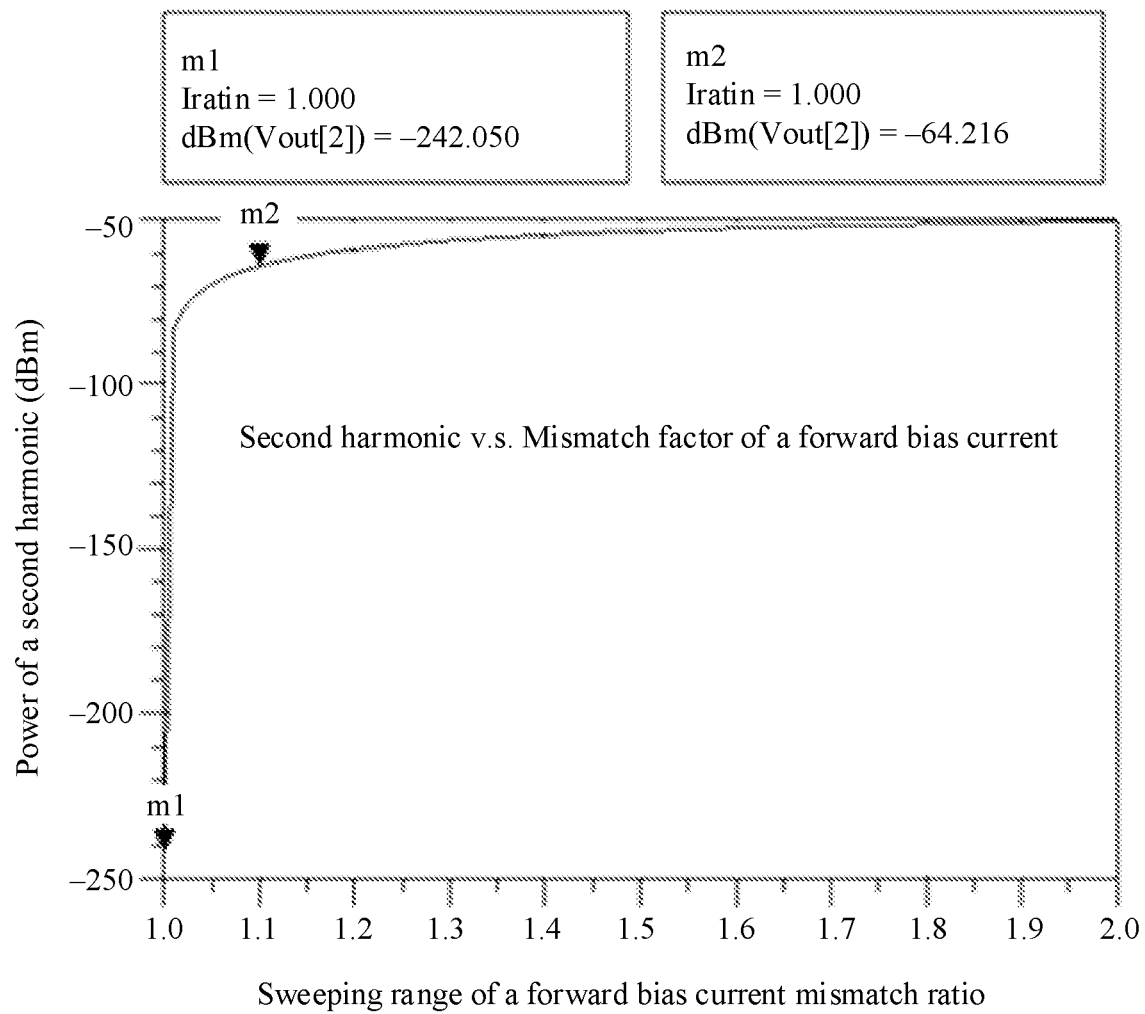
FIG. 9 shows a variation trend of a secondary harmonic of a semiconductor switch device with a reverse bias voltage.
Figure 10:
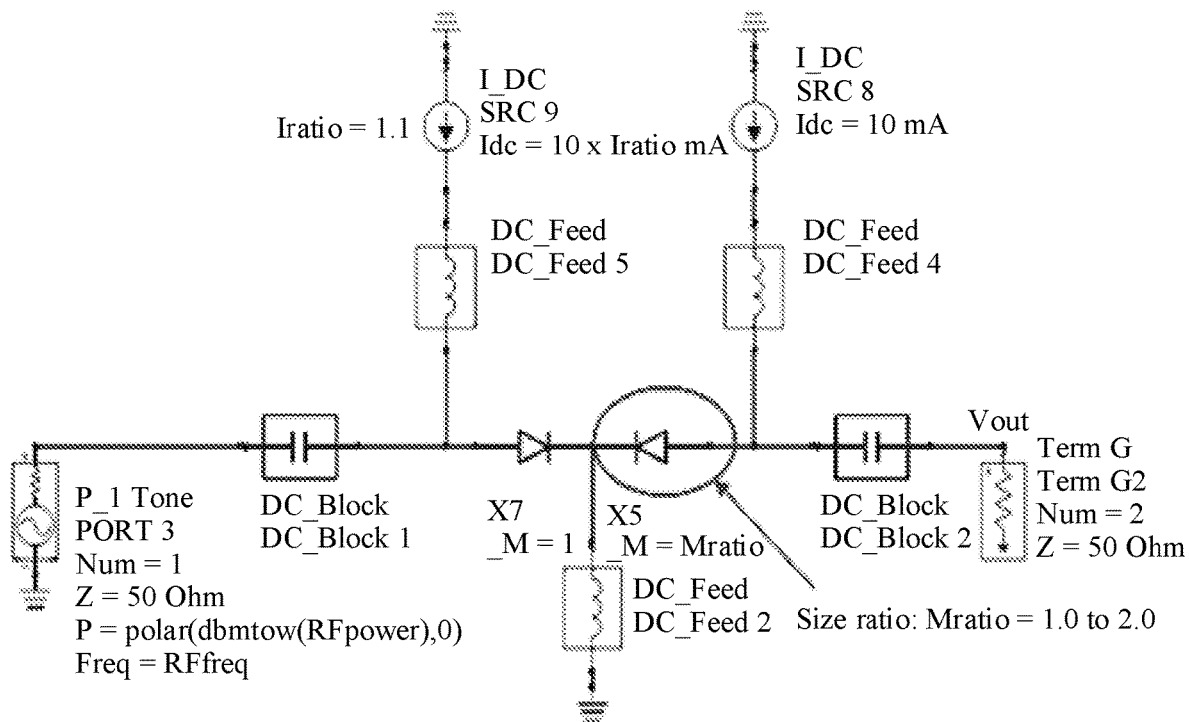
FIG. 10 shows a harmonic simulation circuit in which linearity is improved through a PIN junction size ratio in a case of a forward biased current mismatch.
Figure 11:
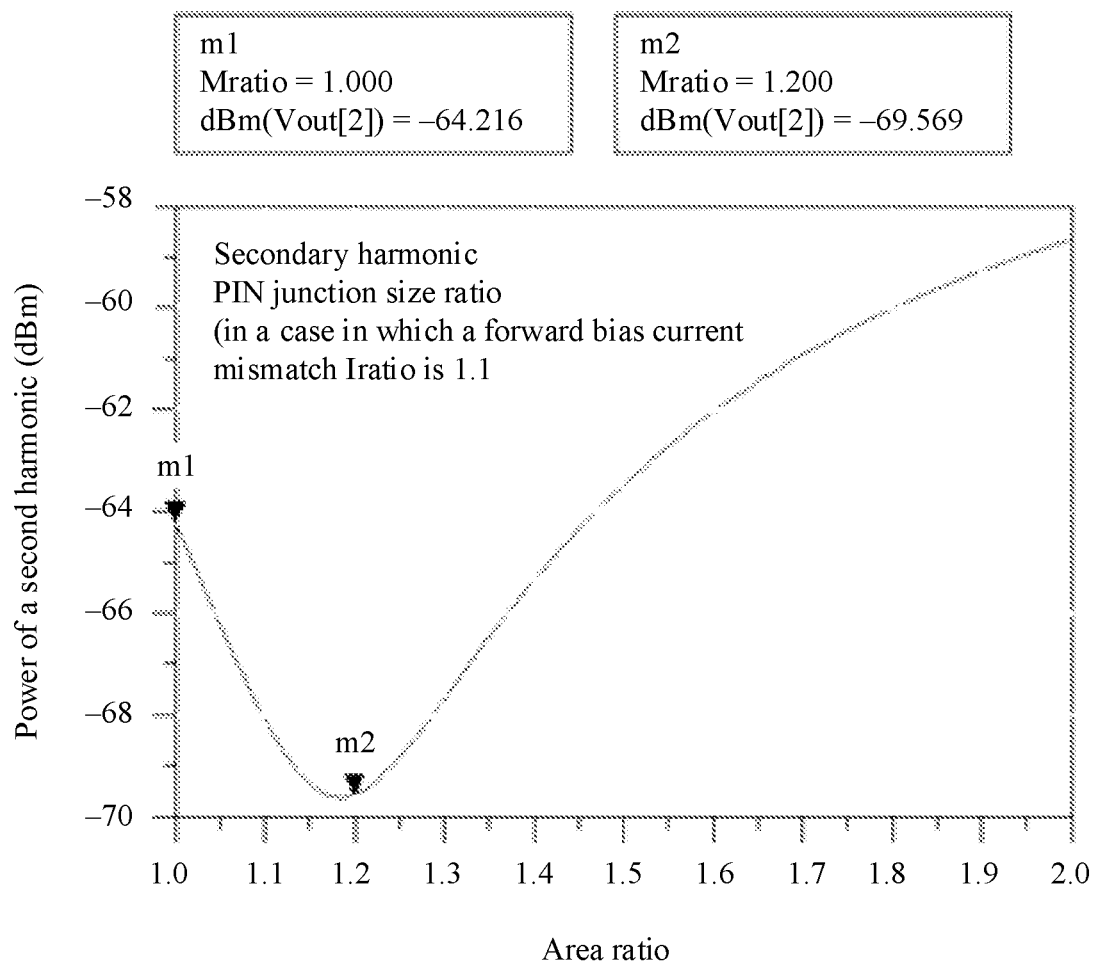
FIG. 11 shows a variation trend of a secondary harmonic with a PIN junction size ratio when a forward bias current mismatch Iratio=1.1.

During application of the semiconductor switch device, even if parameters of the first PIN diode and the second PIN diode that are stacked completely match, a mismatch may still exist in another part of the module circuit. Consequently, a linearity improvement gain brought by the completely matched parameters between the first PIN diode and the second PIN diode is reduced. The mismatch in another part includes a mismatch between circuit layouts, a mismatch between surface mounted devices (SMD), a mismatch between PIN junction bias circuits, or the like. For example, a current mismatch between the PIN junction bias circuits occurs, and that a linearity improvement gain is reduced due to the mismatch is simulated in advanced design system (ADS) software. FIG. 8 shows a harmonic simulation circuit of a semiconductor switch device in a case of a forward bias current mismatch according to an embodiment of this application. During simulation, a reference value of a PIN junction bias current is set to 10 mA. However, there is a ratio difference (Iratio) between bias currents of two PIN diodes (e.g., the first PIN diode and the second PIN diode, and a ratio between the first PIN diode and the second PIN diode is 1:1), and therefore a sweeping range for the simulation is set to 1.0 to 2.0 (i.e., a value of Iratio). FIG. 9 shows a variation trend of a secondary harmonic of a semiconductor switch device with a reverse bias voltage. During simulation, when Iratio deviates from 1.0, that is, a bias current mismatch occurs, a linearity improvement gain rapidly decreases. When Iratio=1.1, a second harmonic is −64 dBm, which is about 20 dB less than −46 dB of a 10 mA bias single-PIN diode (namely, a conventional single-PIN diode). However, there is a large gap with ideal matching when Iratio is 1.0. Therefore, in a case in which a mismatch in another part of the module circuit cannot be avoided, the area ratio between the first PIN diode and the second PIN diode may be actively adjusted to implement compensation. A forward bias current mismatch ratio Iratio=1.1 is used as an example. FIG. 10 shows a harmonic simulation circuit in which linearity is improved through a PIN junction size ratio in a case of a forward biased current mismatch. A variation trend of the second harmonic when the area ratio between the first PIN diode to the second PIN diode is swept is simulated on the ADS software. As shown in FIG. 11, when the area ratio between the first PIN diode and the second PIN diode is equal to about 1.2, an optimal value of the second harmonic is −70 dBm, which is about 6 dB less than a reference value −64 dBm (i.e., the area ratio is equal to 1.0). In this way, a matching effect in the entire module circuit is improved.

Figure 12A:
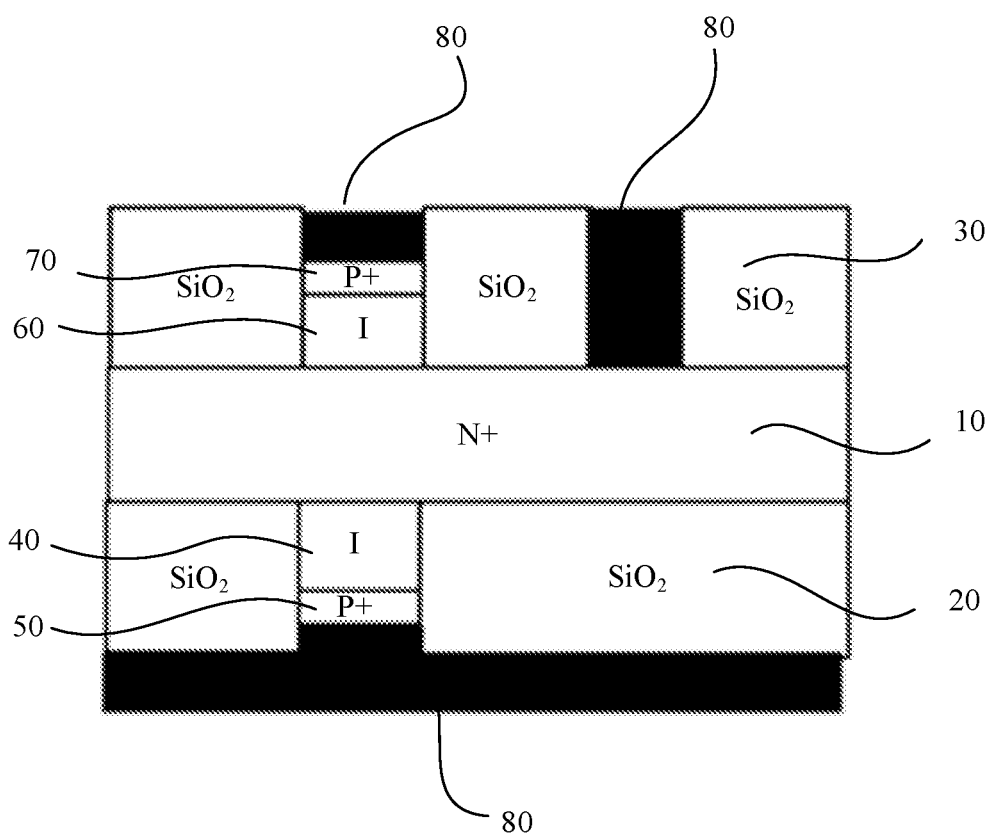
FIG. 12a and FIG. 12b are a schematic diagram of a semiconductor switch device according to an embodiment of this application.
Figure 12B:
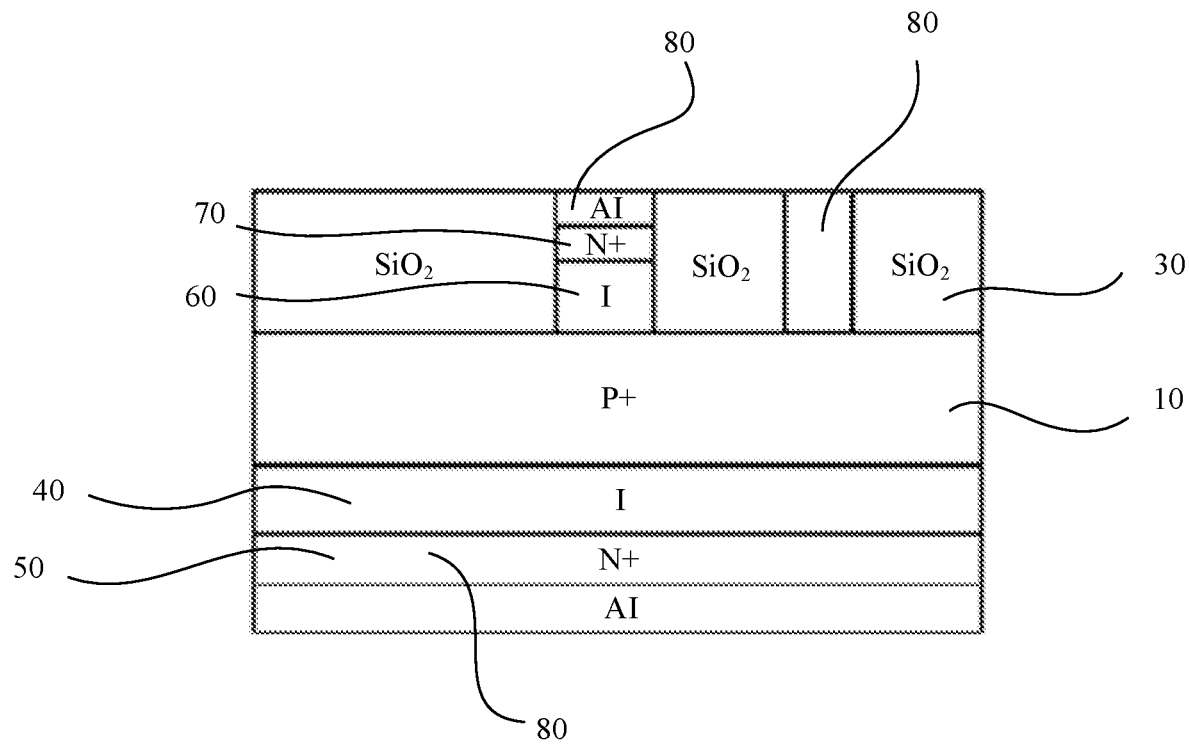

When the first PIN diode and the second PIN diode are formed, to improve security of the device, the exposed second semiconductor and the exposed third semiconductor are packaged for protection. During embodiments of specific implementation, an insulation layer is disposed for protection. As shown in FIG. 12a and FIG. 12b, the semiconductor switch device includes a first insulation layer 30, and the first insulation layer 30 covers at least a part of a surface, of the second semiconductor layer 70, facing away from the first intrinsic layer 60. Alternatively/in addition, the semiconductor switch device includes a second insulation layer 20, where the second insulation layer 20 covers at least a part of a surface, of the third semiconductor layer 50, facing away from the second intrinsic layer 40. Specifically, the semiconductor switch device may include only the first insulation layer 30, or include only the second insulation layer 20, or include both the first insulation layer 30 and the second insulation layer 20. In a structure shown in FIG. 12a, both the first insulation layer 30 and the second insulation layer 20 are included. During specific preparation, as shown in FIG. 12a, the first insulation layer 30 and the second insulation layer 20 are disposed on two sides of the first semiconductor layer 10. In addition, the two insulation layers may be prepared by using a same material, or may be prepared by using different materials. In an embodiment of a specific implementation solution, both the first insulation layer 30 and the second insulation layer 20 are silicon dioxide layers. Certainly, the first insulation layer 30 or the second insulation layer 20 may also be prepared by using another insulation material. A window may be provided on the first insulation layer 30 or the second insulation layer 20. When the area ratio between the first PIN diode and the second PIN diode is not 1:1, correspondingly, areas of windows opened on the first insulation layer 30 and the second insulation layer 20 are different. In addition, to ensure an axisymmetrical structure of the first PIN diode and the second PIN diode, the two opened windows are also axisymmetrically disposed. Specifically, an axis between the upper window and the lower window is on an axis of the first PIN diode.

When being used, the semiconductor switch device needs to be connected to an external circuit. To implement the connection, a pad 80 is disposed. During disposing, as shown in FIG. 12a, a through hole is disposed on the first insulation layer 30 or the second insulation layer 20, and the through hole is filled with the pad 80 connecting to the first semiconductor layer 10. In addition, the pad 80 is also filled in the two windows. The pad 80 may be prepared by using an aluminum material. In addition, the first semiconductor layer 10 may be connected to the external in another manner. For example, the pad 80 is disposed at a part, of the first semiconductor layer 10, not covered by the first insulation layer 30 and the second insulation layer 20, to connect the first semiconductor layer 10 to the external circuit.

Through the foregoing packaging, the semiconductor switch device is in a common-cathode or common-anode three-terminal diode cell package, and finally in a product form of a three-terminal device.

Certainly, in addition to the foregoing structure based on the three-terminal device, another package form may also be used, for example, a package form in a surface mount type, a flip chip type, a beam lead type, or the like. When any one of the foregoing packages is used, the first PIN diode and the second PIN diode can be packaged and connected to the external circuit.

It can be learned from the foregoing description that the semiconductor switch device provided in this embodiment of this application forms a three-terminal device structure. In this integral structure, the first PIN diode and the second PIN diode are oppositely disposed, improving matching between the first PIN diode and the second PIN diode. In addition, compared with prior approaches in which discrete or multi-cell devices are used, this integrated manner greatly improves integration and reduces costs.

For ease of understanding, the following further describes in detail a method for preparing a semiconductor switch device by using the semiconductor switch device shown in FIG. 13a to FIG. 13h as an example.

The preparation method includes the following steps:

Prepare a first semiconductor layer 10, and form a first intrinsic layer 60 and a second intrinsic layer 40 on two opposite surfaces of the first semiconductor layer 10, where the first intrinsic layer 60 and the second intrinsic layer 40 have a same thickness, and are made from materials that have a same doping concentration coefficient.

Form a second semiconductor layer 70 on the first intrinsic layer 60, where the second semiconductor layer 70, the first intrinsic layer 60, and the first semiconductor layer 10 form a first PIN diode, and when one of the second semiconductor layer 70 and the first semiconductor layer 10 is a P+ semiconductor layer, the other is an N+ semiconductor layer.

Form a third semiconductor layer 50 on the second intrinsic layer 40, where the third semiconductor layer 50, the second intrinsic layer 40, and the first semiconductor layer 10 form a second PIN diode, and when one of the third semiconductor layer 50 and the first semiconductor layer 10 is a P+ semiconductor layer, and the other is an N+ semiconductor layer.

The first PIN diode and the second PIN diode are axisymmetrically disposed; and the first semiconductor layer 10 is a P+ semiconductor layer, and the second semiconductor layer 70 and the third semiconductor layer 50 are N+ semiconductor layers; or the first semiconductor layer is an N+ semiconductor layer, and the second semiconductor layer 70 and the third semiconductor layer 50 are P+ semiconductor layers.

When the first semiconductor layer 10 uses different layer structures, correspondingly formed semiconductor switch devices are also different. The following describes a case in which the first semiconductor layer 10 is an N+ semiconductor layer and a case in which the first semiconductor layer 10 is a P+ semiconductor layer.

An example in which the first semiconductor layer is an N+ semiconductor is used.

Step 1: The first semiconductor layer 10 is prepared, where the first semiconductor layer 10 is an N+ semiconductor layer.

Figure 13A:
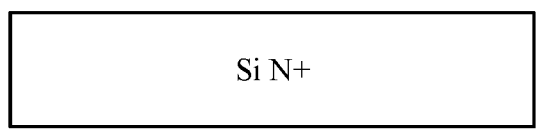
FIG. 13a to FIG. 13h are a flowchart of preparing a common-cathode semiconductor switch device according to an embodiment of this application.

Specifically, as shown in FIG. 13a, an N-type wafer is used as a substrate. An N+ doping layer is formed by doping a phosphorus element, to obtain the first semiconductor layer 10.

Step 2: A first insulation layer 30 is deposited on one surface of the first semiconductor layer 10, and a first window is provided on the first insulation layer 30.

Figure 13B:
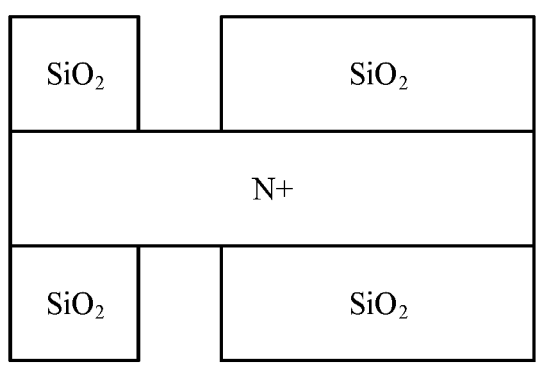

Specifically, as shown in FIG. 13b, a relatively thick silicon dioxide insulation layer is formed at the top of the wafer by using a thermal chemical vapor deposition method. Mask and photoresist methods are used, to selectively remove the silicon dioxide in a region where an intrinsic layer is to be formed, so as to provide the window.

Step 3: A second insulation layer 20 is deposited on another surface of the first semiconductor layer 10, and a second window is provided on the second insulation layer 20.

Specifically, as shown in FIG. 13b, a relatively thick silicon dioxide insulation layer is formed at the bottom of the wafer by using the thermal chemical vapor deposition method. Mask and photoresist methods are used, to selectively remove the silicon dioxide in a region where an intrinsic layer is to be formed, so as to provide the second window.

Step 4: The first intrinsic layer 60 is formed inside the first window.

Figure 13C:
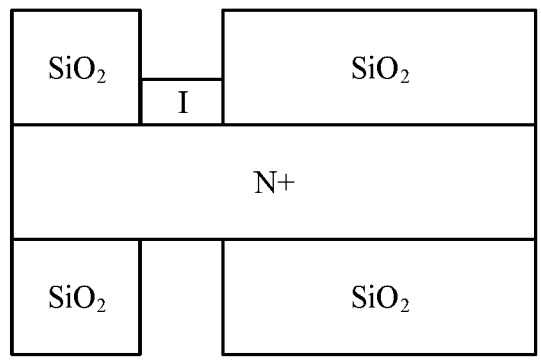

Specifically, as shown in FIG. 13c, a lightly-doped single-crystal N-type layer, namely, the first intrinsic layer 60 is formed inside the window at the insulation layer at the top of the wafer through chemical vapor deposition, diffusion, molecular beam epitaxy, or the like. A thickness of the intrinsic layer needs to be precisely controlled.

Step 5: The second intrinsic layer 40 is formed inside the second window.

Figure 13D:
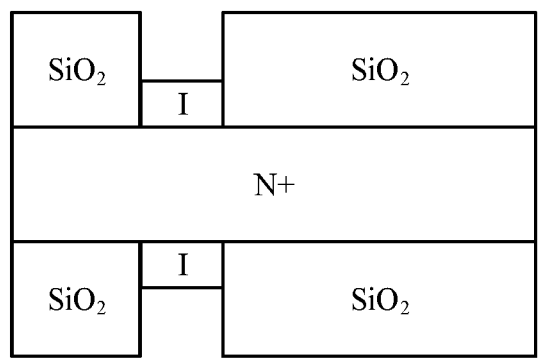

Specifically, as shown in FIG. 13d, a single-crystal N-type layer, namely, the second intrinsic layer is formed at the bottom of the wafer through chemical vapor deposition, diffusion, molecular beam epitaxy, or the like. A thickness of the intrinsic layer needs to be precisely controlled.

Step 6: The second semiconductor layer 70 is formed on the first intrinsic layer 60.

Figure 13E:
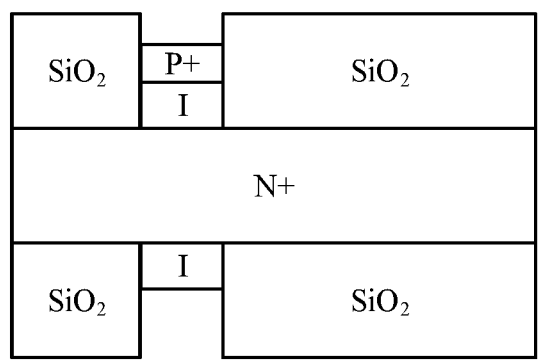

Specifically, the second semiconductor layer 70 is deposited inside the first window and on a surface, of the first intrinsic layer 60, facing away from the first semiconductor layer 10. As shown in FIG. 13e, inside the first window at the top of the wafer, a polysilicon layer is formed by using the chemical vapor deposition method at a high temperature, and then a boron element is diffused into the wafer by using a $B_2O_3$ material at a high temperature, to form a P+ doping layer.

Step 7: The third semiconductor layer 50 is formed on the first intrinsic layer 60.

Figure 13F:
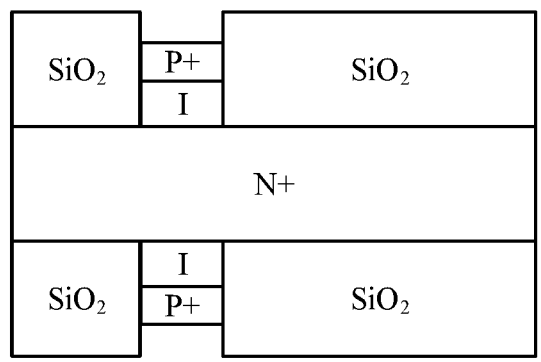

Specifically, the third semiconductor layer 50 is deposited inside the second window and on a surface, of the second intrinsic layer 40, facing away from the first semiconductor layer 10. As shown in FIG. 13f, inside the second window at the bottom of the wafer, a polysilicon layer is formed by using the chemical vapor deposition method at a high temperature, and then a boron element is diffused into the wafer by using a $B_2O_3$ material at a high temperature, to form a P+ doping layer.

Step 8: A pad 80 is separately formed on the first semiconductor layer 10, the second semiconductor layer 70, and the third semiconductor layer 50.

Figure 13G:
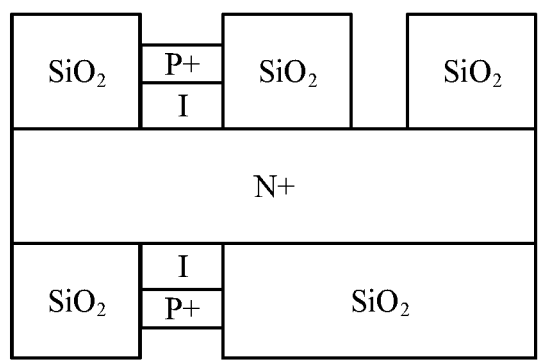

Specifically, as shown in FIG. 13g, at the top of the wafer, mask and photoresist methods are used, to selectively remove the silicon dioxide in a region where a common-cathode (N+) contact hole is to be formed, so as to provide the window.

Figure 13H:
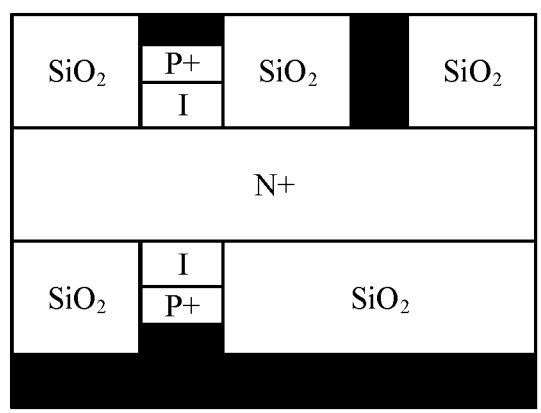

Step 9: As shown in FIG. 13h, annealing is separately performed in an oxygen environment and a nitrogen environment at a high temperature. Finally, aluminum is deposited to form the pad 80, and annealing is performed in a mixture of nitrogen and hydrogen at a high temperature.

An embodiment of a process implementation procedure of a common-anode three-terminal diode cell is as follows:

Step a: The first semiconductor layer 10 is prepared, where the first semiconductor layer 10 is a P+ semiconductor layer.

Figure 14A:
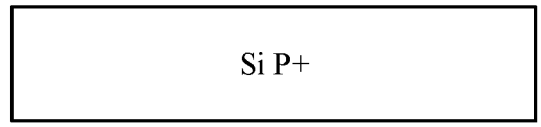
FIG. 14a to FIG. 14h are a flowchart of preparing a common-anode semiconductor switch device according to an embodiment of this application.

Specifically, as shown in FIG. 14a, a P-type wafer is prepared and used as a substrate. A P+ doping layer is formed by doping a phosphorus element.

Step b: A first insulation layer 30 is deposited on one surface of the first semiconductor layer 10, and a first window is provided on the first insulation layer 30.

Figure 14B:
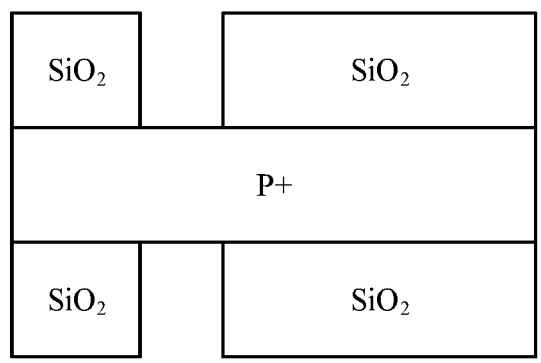

Specifically, as shown in FIG. 14b, a relatively thick silicon dioxide insulation layer is formed at the top of the wafer by using a thermal chemical vapor deposition method. Mask and photoresist methods are used, to selectively remove the silicon dioxide in a region where an intrinsic layer is to be formed, so as to provide the window.

Step c: A second insulation layer 20 is deposited on another surface of the first semiconductor layer 10, and a second window is provided on the second insulation layer 20.

Specifically, as shown in FIG. 14b, a relatively thick silicon dioxide insulation layer is formed at the bottom of the wafer by using the thermal chemical vapor deposition method. Mask and photoresist methods are used, to selectively remove the silicon dioxide in a region where an intrinsic layer is to be formed, so as to provide the second window.

Step d: The first intrinsic layer 60 is formed inside the first window.

Figure 14C:
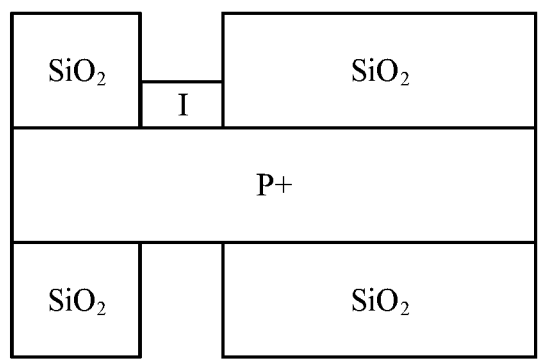

Specifically, as shown in FIG. 14c, a lightly-doped single-crystal P-type layer, namely, the upper-layer intrinsic layer is formed inside the window at the insulation layer at the top of the wafer through chemical vapor deposition, diffusion, molecular beam epitaxy, or the like. A thickness of the intrinsic layer needs to be precisely controlled.

Step e: The second intrinsic layer 40 is formed inside the second window.

Figure 14D:
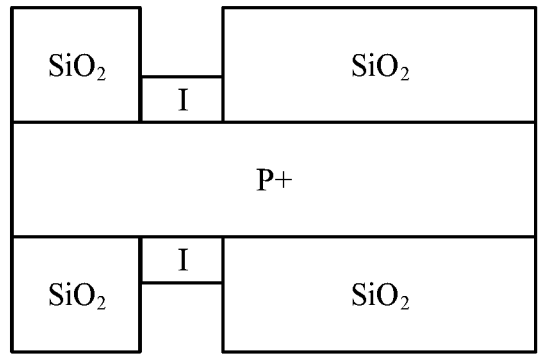

Specifically, as shown in FIG. 14d, a single-crystal P-type layer, namely, the lower-layer intrinsic layer is formed at the bottom of the wafer through chemical vapor deposition, diffusion, molecular beam epitaxy, or the like. A thickness of the intrinsic layer needs to be precisely controlled.

Step f: The second semiconductor layer 70 is formed on the first intrinsic layer 60.

Figure 14E:
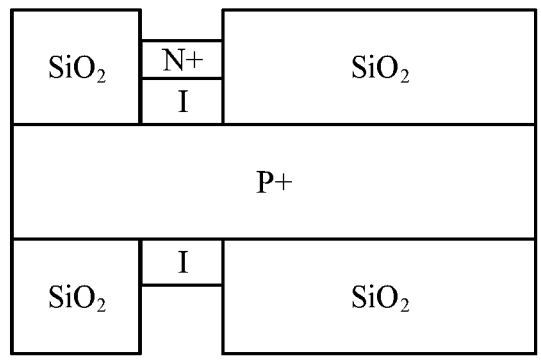

Specifically, the second semiconductor layer 70 is deposited inside the first window and on a surface, of the first intrinsic layer 60, facing away from the first semiconductor layer 10. As shown in FIG. 14e, inside the window at the insulation layer at the top of the wafer, a polysilicon layer is formed by using the chemical vapor deposition method at a high temperature, and then a phosphorus element is diffused into the wafer at a high temperature, to form an N+ doping layer.

Step g: The third semiconductor layer 50 is formed on the first intrinsic layer 60.

Figure 14F:
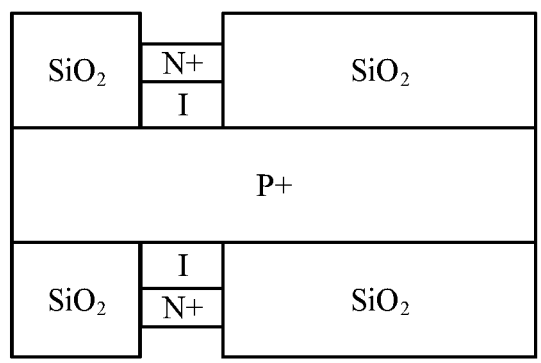

Specifically, the third semiconductor layer 50 is deposited inside the second window and on a surface, of the second intrinsic layer 40, facing away from the first semiconductor layer 10. As shown in FIG. 14f, at the bottom of the wafer, a polysilicon layer is formed by using the chemical vapor deposition method at a high temperature, and then a phosphorus element is diffused into the wafer at a high temperature, to form an N+ doping layer.

Step h: A pad 80 is separately formed on the first semiconductor layer 10, the second semiconductor layer 70, and the third semiconductor layer 50.

Figure 14G:
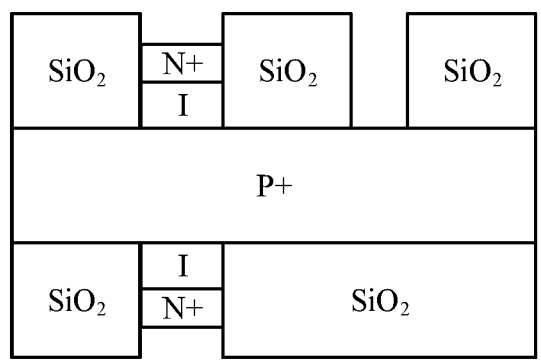

Specifically, as shown in FIG. 14g, at the top of the wafer, mask and photoresist methods are used, to selectively remove the silicon dioxide in a region where a common-anode (P+) contact hole is to be formed, so as to provide the window.

Figure 14H:
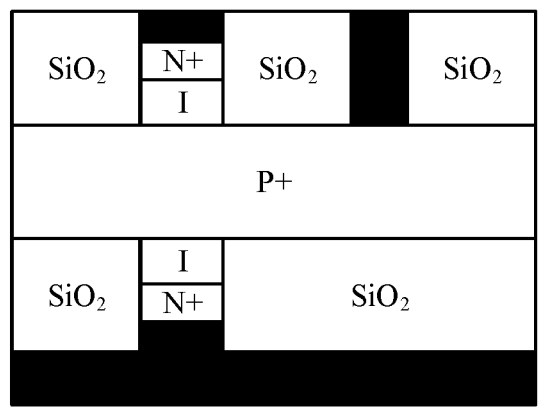

Step i: As shown in FIG. 14h, annealing is performed separately in an oxygen environment and a nitrogen environment at a high temperature. Finally, aluminum is deposited to form the pad 80, and annealing is performed in a mixture of nitrogen and hydrogen at a high temperature.

It should be understood that, the foregoing specific preparation method is merely used as an example for the Si-related process for preparing the semiconductor switch device, and details such as a specific Si material and a specific doping material (for example, phosphorus) are not limited.

During preparation of the foregoing structures, chemical vapor deposition (CVD) or molecular beam epitaxial (MBE) techniques are used to reform a traditional PIN diode process, so that a structure with the plurality of layers: the P+ doping layer, the intrinsic layer, and the N+ doping layer alternately stacked can be formed on the wafer substrate material. Compared with a conventional PIN diode, the PIN diodes prepared according to the preparation method provided in this embodiment of this application have two PIN junctions integrated in a vertical direction of a wafer.

In addition, this application further provides a solid-state phase shifter. The solid-state phase shifter includes the semiconductor switch devices, according to any one of the foregoing possible implementation embodiments, on a plurality of branches, where at least one of the semiconductor switch devices is disposed on each branch, and a phase difference is generated between radio frequency signals transmitted on the plurality of branches by turning on or off the semiconductor switch device. In the used semiconductor switch device, the two PIN diodes each having a geometrically centrosymmetric pattern are used, to implement parameter self-matching between the two PIN diodes and therefore improve linearity. In this way, an effect of the solid-state phase shifter is improved.

In addition, an embodiment of this application further includes a massive multiple-input multiple-output (Massive MIMO) antenna array, where the antenna array includes the foregoing solid-state phase shifter and a plurality of antenna units, and the solid-state phase shifter is configured to change a phase relationship between the plurality of antenna units. In the used semiconductor switch device in the solid-state phase shifter, the two PIN diodes each having a geometrically centrosymmetric pattern are used, to implement parameter self-matching between the two PIN diodes and therefore improve linearity. In this way, a use effect of the antenna array is improved.

An embodiment of this application provides a communications device. The communications device includes the massive multiple-input multiple-output antenna array and a radio frequency signal transceiver. The massive multiple-input multiple-output antenna array is configured to receive a radio frequency signal sent by the radio frequency signal transceiver, or is configured to send a radio frequency signal to the radio frequency signal transceiver. By using the foregoing antenna array, a communication effect of the communications device is improved.

The foregoing descriptions are merely specific embodiments of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A semiconductor switch device, comprising:
   a second semiconductor layer, a first intrinsic layer, a first semiconductor layer, a second intrinsic layer, and a third semiconductor layer stacked in a sandwich structure, wherein the first intrinsic layer and the second intrinsic layer have a same thickness and are made from materials that have a same doping concentration coefficient;
   the first intrinsic layer is located between the second semiconductor layer and the first semiconductor layer, and the second semiconductor layer, the first intrinsic layer, and the first semiconductor layer form a first PIN diode;
   a first insulation layer that covers at least a part of a surface of the second semiconductor layer facing away from the first intrinsic layer;
   the second intrinsic layer is located between the third semiconductor layer and the first semiconductor layer, and the third semiconductor layer, the second intrinsic layer, and the first semiconductor layer form a second PIN diode;
   the first PIN diode and the second PIN diode are axisymmetrically disposed; and the first semiconductor layer is an N+ semiconductor layer, and the second semiconductor layer and the third semiconductor layer are P+ semiconductor layers, or the first semiconductor layer is a P+ semiconductor layer, and the second semiconductor layer and the third semiconductor layer are N+ semiconductor layers.

2. The semiconductor switch device according to claim 1, wherein a ratio of an area of a surface of the second semiconductor layer facing the first semiconductor layer, to an area of a surface of the third semiconductor layer facing the first semiconductor layer, is 1:N, wherein N is a rational number greater than or equal to 1.

3. The semiconductor switch device according to claim 1, wherein in a direction of a thickness of the first semiconductor layer, a projection of the second semiconductor layer on a first plane coincides with a projection of the third semiconductor layer on the first plane, and the first plane is a plane on which a surface, of the third semiconductor layer facing the second semiconductor layer is located.

4. The semiconductor switch device according to claim 1, wherein a through hole is disposed on the first insulation layer, and the through hole is filled with a pad connecting to the first semiconductor layer.

5. The semiconductor switch device according to claim 4, further comprising a second insulation layer that covers at least a part of a surface of the third semiconductor layer facing away from the second intrinsic layer.

6. A solid-state phase shifter, comprising:
a plurality of semiconductor switch devices on a plurality of branches, wherein at least one of the semiconductor switch devices is disposed on each branch, and a phase difference is generated between radio frequency signals transmitted on the plurality of branches by turning on or off semiconductor switch devices;
wherein each semiconductor switch device comprises a second semiconductor layer, a first intrinsic layer, a first semiconductor layer, a second intrinsic layer, and a third semiconductor layer stacked in a sandwich structure, wherein the first intrinsic layer and the second intrinsic layer have a same thickness, and are made from materials that have a same doping concentration coefficient;
the first intrinsic layer is located between the second semiconductor layer and the first semiconductor layer, and the second semiconductor layer, the first intrinsic layer, and the first semiconductor layer form a first PIN diode;
the second intrinsic layer is located between the third semiconductor layer and the first semiconductor layer, and the third semiconductor layer, the second intrinsic layer, and the first semiconductor layer form a second PIN diode;
the first PIN diode and the second PIN diode are axisymmetrically disposed; and
the first semiconductor layer is an N+ semiconductor layer, and the second semiconductor layer and the third semiconductor layer are P+ semiconductor layers, or
the first semiconductor layer is a P+ semiconductor layer, and the second semiconductor layer and the third semiconductor layer are N+ semiconductor layers.

7. The solid-state phase shifter according to claim 6, wherein a ratio of an area of a surface of the second semiconductor layer facing the first semiconductor layer, to an area of a surface of the third semiconductor layer facing the first semiconductor layer, is 1:N, wherein N is a rational number greater than or equal to 1.

8. The solid-state phase shifter according to claim 6, wherein in a direction of a thickness of the first semiconductor layer, a projection of the second semiconductor layer on a first plane coincides with a projection of the third semiconductor layer on the first plane, and the first plane is a plane on which a surface, of the third semiconductor layer, facing the second semiconductor layer is located.

9. The solid-state phase shifter according to claim 6, further comprising a first insulation layer that covers at least a part of a surface of the second semiconductor layer facing away from the first intrinsic layer.

10. The solid-state phase shifter according to claim 9, wherein a through hole is disposed on the first insulation layer, and the through hole is filled with a pad connecting to the first semiconductor layer.

11. The semiconductor switch device according to claim 9, further comprising a second insulation layer that covers at least a part of a surface of the third semiconductor layer facing away from the second intrinsic layer.

12. A massive multiple-input multiple-output (Massive MIMO) antenna array, comprising:
a solid-state phase shifter and a plurality of antenna units, wherein the solid-state phase shifter is configured to change a phase relationship between the plurality of antenna units;
the solid-state phase shifter comprises a plurality of semiconductor switch devices on a plurality of branches, wherein at least one of the semiconductor switch devices is disposed on each branch, and a phase difference is generated between radio frequency signals transmitted on the plurality of branches by turning on or off semiconductor switch devices;
wherein each semiconductor switch device comprises a second semiconductor layer, a first intrinsic layer, a first semiconductor layer, a second intrinsic layer, and a third semiconductor layer that are stacked in a sandwich structure, wherein the first intrinsic layer and the second intrinsic layer have a same thickness, and are made from materials that have a same doping concentration coefficient;
the first intrinsic layer is located between the second semiconductor layer and the first semiconductor layer, and the second semiconductor layer, the first intrinsic layer, and the first semiconductor layer form a first PIN diode;
the second intrinsic layer is located between the third semiconductor layer and the first semiconductor layer, and the third semiconductor layer, the second intrinsic layer, and the first semiconductor layer form a second PIN diode;
the first PIN diode and the second PIN diode are axisymmetrically disposed; and
the first semiconductor layer is an N+ semiconductor layer, and the second semiconductor layer and the third semiconductor layer are P+ semiconductor layers, or
the first semiconductor layer is a P+ semiconductor layer, and the second semiconductor layer and the third semiconductor layer are N+ semiconductor layers.

13. The solid-state phase shifter according to claim 12, wherein a ratio of an area of a surface of the second semiconductor layer facing the first semiconductor layer, to an area of a surface of the third semiconductor layer facing the first semiconductor layer, is 1:N, wherein N is a rational number greater than or equal to 1.

14. The solid-state phase shifter according to claim 12, wherein in a direction of a thickness of the first semiconductor layer, a projection of the second semiconductor layer on a first plane coincides with a projection of the third semiconductor layer on the first plane, and the first plane is a plane on which a surface, of the third semiconductor layer, facing the second semiconductor layer is located.

15. The solid-state phase shifter according to claim 12, further comprising a first insulation layer that covers at least a part of a surface of the second semiconductor layer facing away from the first intrinsic layer.

16. The solid-state phase shifter according to claim 15, wherein a through hole is disposed on the first insulation layer, and the through hole is filled with a pad connecting to the first semiconductor layer.

17. The semiconductor switch device according to claim 15, further comprising a second insulation layer that covers at least a part of a surface of the third semiconductor layer facing away from the second intrinsic layer.

* * * * *